US012660373B2

(12) United States Patent
Ono

(10) Patent No.: US 12,660,373 B2
(45) Date of Patent: Jun. 16, 2026

(54) LIGHT EMITTER, LIGHT SOURCE DEVICE, AND MEASUREMENT APPARATUS

(71) Applicant: FUJIFILM Business Innovation Corp., Tokyo (JP)

(72) Inventor: Seiji Ono, Kanagawa (JP)

(73) Assignee: FUJIFILM Business Innovation Corp., Tokyo (JP)

( * ) Notice: Subject to any disclaimer, the term of this patent is extended or adjusted under 35 U.S.C. 154(b) by 790 days.

(21) Appl. No.: 17/986,852

(22) Filed: Nov. 14, 2022

(65) Prior Publication Data

US 2023/0246119 A1    Aug. 3, 2023

(30) Foreign Application Priority Data

Feb. 2, 2022    (JP) ................................. 2022-014959

(51) Int. Cl.
H10H 20/813        (2025.01)
G01S 17/36         (2006.01)
H10H 20/857        (2025.01)

(52) U.S. Cl.
CPC ........... H10H 20/813 (2025.01); G01S 17/36 (2013.01); H10H 20/857 (2025.01)

(58) Field of Classification Search
CPC ..... H10H 20/813; H10H 20/857; G01S 17/36
USPC ........................................................ 257/80
See application file for complete search history.

(56) References Cited

U.S. PATENT DOCUMENTS

| | | | | |
|---|---|---|---|---|
| 2004/0046976 A1* | 3/2004 | Ohno | ................. | G06K 15/1247 358/509 |
| 2010/0157011 A1* | 6/2010 | Ohno | ................. | B41J 2/451 315/320 |
| 2010/0225727 A1* | 9/2010 | Ohno | ................. | G06K 15/1247 315/320 |
| 2014/0320577 A1* | 10/2014 | Ohno | ................. | G02B 27/0087 257/113 |
| 2020/0244039 A1* | 7/2020 | Kondo | ................. | H01S 5/426 |

FOREIGN PATENT DOCUMENTS

JP        2002111063        4/2002

OTHER PUBLICATIONS

"Office Action of Japan Counterpart Application", issued on Aug. 6, 2024, with English translation thereof, pp. 1-5.

* cited by examiner

*Primary Examiner* — Igwe U Anya
(74) *Attorney, Agent, or Firm* — JCIPRNET

(57)        ABSTRACT

A light emitter includes: a light emitting unit that has multiple light emitting points; and a shifting unit that sets in a shift operation the light emitting points that are to be lit by the light emitting unit. The shifting unit includes multiple starting points where the shift operation starts, multiple blocks that undergo the shift operation from the starting points, and a shift signal line that is commonly arranged for the blocks and selects a block that undergoes the shift operation in response to a shift signal.

18 Claims, 13 Drawing Sheets

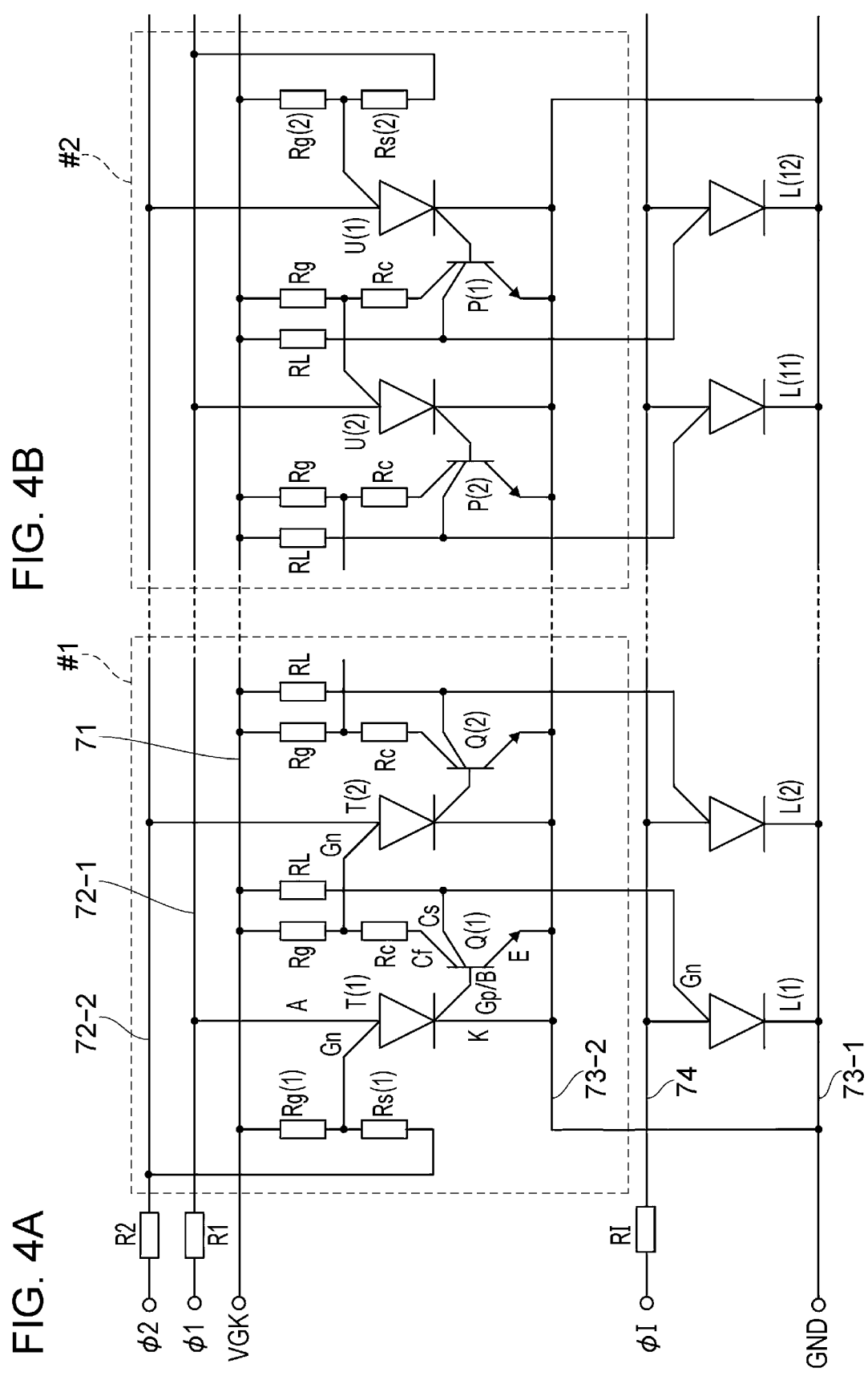

LIGHT EMITTER, LIGHT SOURCE DEVICE, AND MEASUREMENT APPARATUS

CROSS-REFERENCE TO RELATED APPLICATIONS

This application is based on and claims priority under 35 USC 119 from Japanese Patent Application No. 2022-014959 filed Feb. 2, 2022.

BACKGROUND

(i) Technical Field

The present disclosure relates to a light emitter, a light source device, and a measurement apparatus.

Japanese Unexamined Patent Application Publication No. 2002-111063 discloses a self-scanning light emitting element array chip that includes a right-hand side circuit and left-hand side circuit which share only a power source VGK but have different clock pulses $\phi1$ and $\phi2$, start pulse $\phi S$, and write pulse $\phi I$.

(ii) Related Art

One of light emitters available includes a light emitting unit that has multiple light emitting points and a shifting unit that sets a light emitting point to cause the light emitting element to light in a shift operation. The shift operation is performed from a leading portion to a trailing portion of the light emitting unit in the order of shift and if the number of light emitting points to be set in the shift operation is larger, a light emitting point closer to the trailing portion takes more time to be caused to light. The shifting unit may be divided into multiple blocks but if a shift signal line to make the shift operation is arranged on a per block basis, the number of shift signal lines increases. The light emitter may become larger in size and driving the light emitter may be more complex.

SUMMARY

Aspects of non-limiting embodiments of the present disclosure relate to providing a light emitter that controls an increase in the number of shift signal lines while shortening time to set the light emitting points.

Aspects of certain non-limiting embodiments of the present disclosure address the above advantages and/or other advantages not described above. However, aspects of the non-limiting embodiments are not required to address the advantages described above, and aspects of the non-limiting embodiments of the present disclosure may not address advantages described above.

According to an aspect of the present disclosure, there is provided a light emitter including: a light emitting unit that has multiple light emitting points; and a shifting unit that sets in a shift operation the light emitting points that are to be lit by the light emitting unit, wherein the shifting unit includes multiple starting points where the shift operation starts, multiple blocks that undergo the shift operation from the starting points, and a shift signal line that is commonly arranged for the blocks and selects a block that undergoes the shift operation in response to a shift signal.

BRIEF DESCRIPTION OF THE DRAWINGS

Exemplary embodiments of the present disclosure will be described in detail based on the following figures, wherein:

FIGS. 1A and 1B illustrate a light source device of a first exemplary embodiment, wherein FIG. 1A is a schematic diagram of the light source device, and FIG. 1B is an equivalent circuit diagram of a light emitter included in the light source device;

FIGS. 2A and 2B illustrate an operation of the light emitter including shift thyristors, light emitting thyristors, and coupling transistors, wherein FIG. 2A is an equivalent circuit diagram of the light emitter, and FIG. 2B is a cross-sectional view of the shift thyristor and coupling transistor;

FIGS. 3A and 3B illustrate a layout and cross section of the light emitter, wherein FIG. 3A illustrates the layout of the light emitter and FIG. 3B illustrates the cross section taken along line IIIB-IIIB;

FIGS. 4A and 4B are enlarged views illustrating the operation of the light emitter, wherein FIG. 4A illustrates one end portion of the light emitter and FIG. 4B illustrates the other end portion of the light emitter;

FIG. 6 is an equivalent circuit diagram of a light emitter cited for comparison;

FIG. 7 is a timing diagram illustrating the operation of the light emitter cited for comparison;

FIGS. 8A and 8B illustrate a light source device of a second exemplary embodiment, wherein FIG. 8A is a schematic diagram of the light source device, and FIG. 8B is an equivalent circuit diagram of a light emitter included in the light source device;

FIG. 11 is a timing diagram illustrating the operation of the light emitter;

FIGS. 12A and 12B illustrate a modification of the light emitting point, wherein FIG. 12A illustrates a configuration where a light emitting diode or a laser diode is arranged to the anode side of a light emitting thyristor and FIG. 12B illustrates a configuration where the light emitting diode or laser diode is arranged on the cathode side of the light emitting thyristor.

DETAILED DESCRIPTION

Figures 2A, 2B:
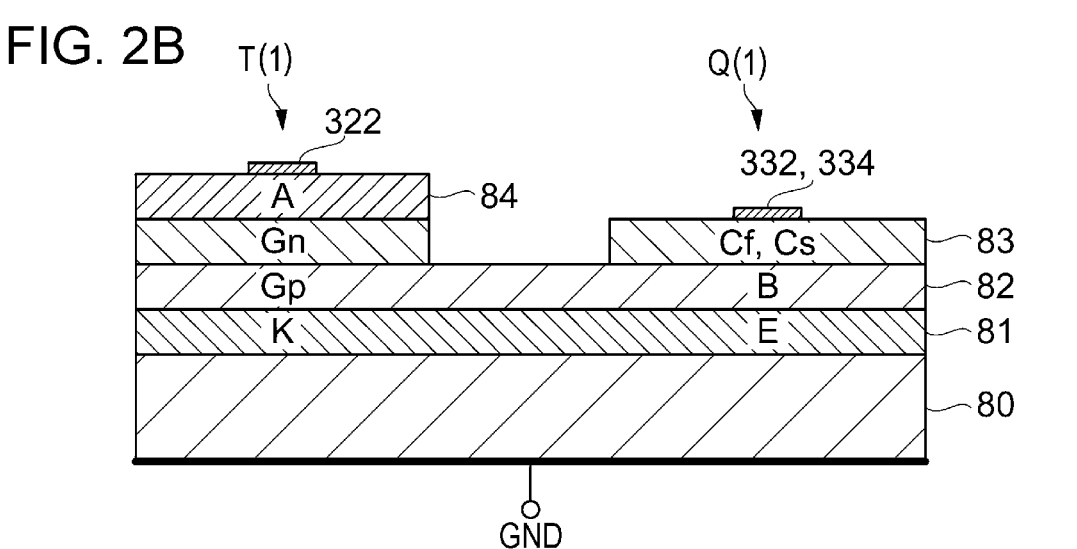

Embodiments of the disclosure are described with reference to the attached drawings.

A light emitter includes a light emitting unit and shifting unit. The light emitting unit includes multiple light emitting elements as light emitting points. The shifting unit sets the light emitting elements to light in a shift operation, and thus causes the set light emitting element to light. The light emitting element is also referred to as the light emitting point.

First Exemplary Embodiment

Figures 1A, 1B:
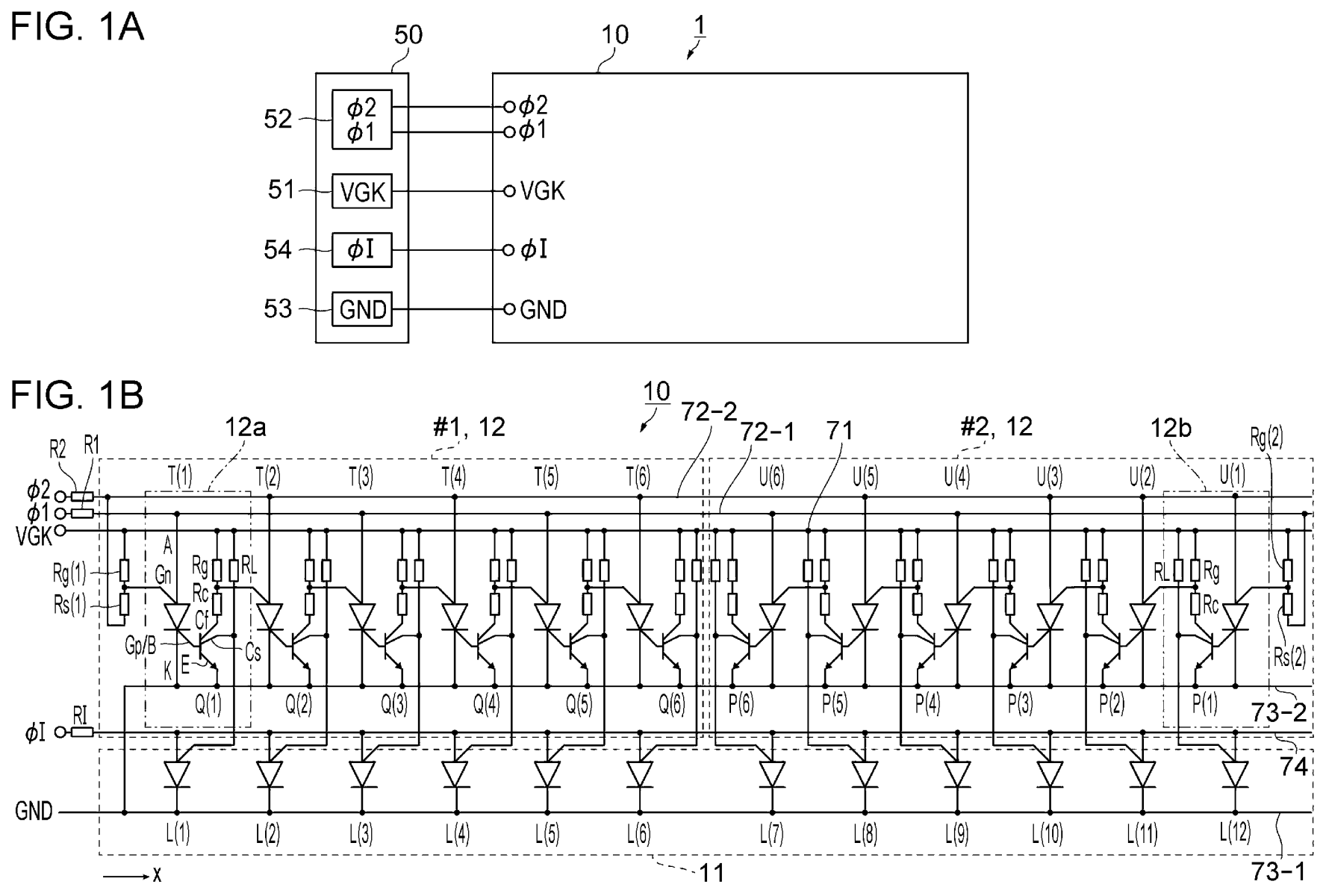

FIGS. 1A and 1B illustrate a light source device 1 of a first exemplary embodiment. FIG. 1A is a schematic diagram of the light source device 1. FIG. 1B is an equivalent circuit diagram of a light emitter 10 included in the light source device 1. Referring to FIG. 1B, the rightward direction of the page of FIGS. 1A and 1B is referred to as +x direction.

Thyristors and transistors are denoted by symbols thereof, and resistors are denoted by rectangles. The same is true of other figures.

The light source device 1 illustrated in FIG. 1A includes the light emitter 10 and driver 50. The driver 50 includes a power source voltage supplier 51, shift signal supplier 52, ground voltage supplier 53, and light emission signal supplier 54 and controls the light emitter 10. The light emitter 10 includes a VGK terminal, φ1 terminal, φ2 terminal, GND terminal, and φI terminal. GND denotes a ground voltage serving as a reference voltage, and VGK denotes a power source voltage. The VGK terminal, #1 terminal, φ2 terminal, GND terminal, and φI terminal are examples of connection terminals.

Light Source Device 1

The power source voltage supplier 51 in the driver 50 supplies a power source voltage VGK to the VGK terminal of the light emitter 10. The shift signal supplier 52 in the driver 50 respectively supplies shift signals φ1 and φ2 to the φ1 and φ2 terminals of the light emitter 10. The ground voltage supplier 53 in the driver 50 supplies a ground voltage GND to the GND terminal of the light emitter 10. The light emission signal supplier 54 in the driver 50 supplies a light emission signal φI to the φI terminal of the light emitter 10. The shift signals φ1 and φ2 are supplied to the shifting unit 12 illustrated in FIG. 1B and successively shifts shift transistors T and U to an on state. Successively shifting the shift transistors to the on state may also be referred to as successively transitioning the shift transistors to the on state. The shift signals φ1 and φ2 may also be referred to as transfer signals φ1 and φ2 and the shift thyristors T and U may also be referred to as transfer thyristors T and U. The shift thyristors T and U are examples of shift elements.

Figure 5:
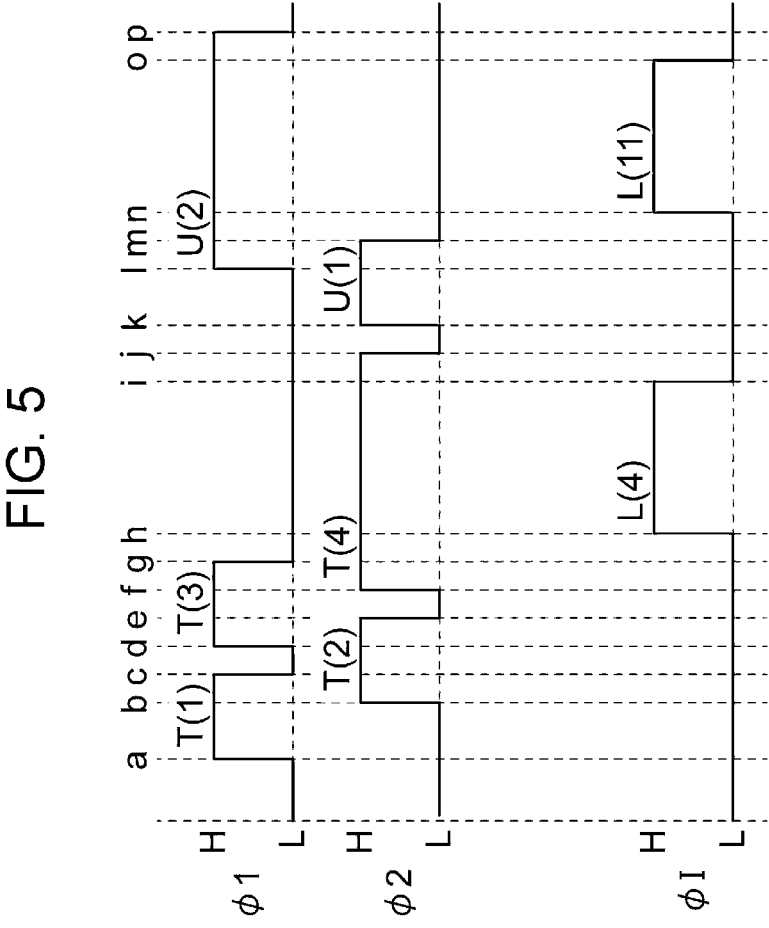
FIG. 5 is a timing diagram illustrating the operation of the light emitter.

The driver 50 generates the shift signals φ1 and φ2 and light emission signal φI as illustrated in FIG. 5 below and supplies the generated shift signals φ1 and φ2 and light emission signal φI to the light emitter 10. The driver 50 itself may generate the shift signals φ1 and φ2 and light emission signal φI or may generate the shift signals φ1 and φ2 and light emission signal φI in response to an instruction from a control apparatus arranged external to the light source device 1.

Light Emitter 10

The light emitter 10 is described with reference to FIG. 1B. The light emitter 10 includes a light emitting unit 11 and shifting unit 12. The light emitting unit 11 includes light emitting thyristors L(1) through L(12) as examples of light emitting elements. The light emitting thyristors L(1) through L(12) are arranged in one direction (+x direction) in the light emitting unit 11. The light emitting thyristors L(1) through L(12), if not differentiated from each other, are representatively referred to as a light emitting thyristor L.

The shifting unit 12 is divided into two blocks, namely, blocks φ1 and φ2. Referring to FIG. 1B, the blocks are denoted by blocks #1(12) and φ2(12). The block #1 includes shift thyristors T(1) through T(6) and coupling transistors Q(1) through Q(6). The shift thyristors T(1) through T(6) and coupling transistors Q(1) through Q(6) are arranged from one end portion to the central portion of the light emitter 10 (in an −x direction). Each of the shift thyristors T(1) through T(6), if not differentiated from each other, is representatively referred to as a shift thyristor T and each of the coupling transistors Q(1) through Q(6), if not differentiated from each other, is representatively referred to as a coupling transistor Q. A single shift thyristor T and a single coupling transistor Q form a shifting unit 12a. The shifting unit 12a, including the shift thyristor T(1) and coupling transistor Q(1), is enclosed by a dashed line. The shifting unit 12a further includes a power source line resistor Rg, coupling resistor Rc, and power source line resistor RL. The block #1 includes six shifting units 12a. Although the shift thyristors T and the coupling transistors Q are differentiated by attaching numbers, other elements are not denoted by numbers. FIG. 1B illustrates the power source line resistor Rg, coupling resistor Rc, and power source line resistor RL in the region of the shift thyristor T(1) and coupling transistor P(1) but the power source line registers and coupling resistors are not denoted by reference in the regions of other shift thyristors T and the coupling transistor Q. The block φ1 includes a power source line resistor Rg(1) and start resistor Rs(1) at the one end portion (of the −x direction).

The coupling transistor Q in the shifting unit 12a is connected to one of light emitting thyristors L of the light emitting unit 11. Specifically, the coupling transistors Q(1) through Q(6) are respectively connected to light emitting thyristors L(1) through L(6).

The block φ2 includes shift thyristors U(1) through U(6) and coupling transistors P(1) through P(6). The shift thyristors U(1) through U(6) and coupling transistors P(1) through P(6) are arranged from the other end portion to the central portion of the light emitter 10 (in the −x direction). Each of the shift thyristors U(1) through U(6), if not differentiated from each other, is referred to as a shift thyristor U and each of the coupling transistors P(1) through P(6), if not differentiated from each other, is referred to as a coupling transistor P. A single shift thyristor U and a single coupling transistor P form a shifting unit 12B. The shifting unit 12B, including the shift thyristor U(1) and coupling transistor P(1), is enclosed by a dashed line. The shifting unit 12B further includes a power source line resistor Rg, coupling resistor Rc, and power source line resistor RL. The block φ2 includes six shifting units 12B. Although the shift thyristor U and coupling transistors P are differentiated by attaching numbers thereto, other elements are not denoted by numbers. The block φ2 includes a power source line resistor Rg(2) and start resistor Rs(2) at the other end portion (of the +x direction).

The coupling transistor P in the shifting unit 12B is connected to one of the light emitting thyristors L of the light emitting unit 11. Specifically, the coupling transistors P(1) through P(6) are respectively connected to the light emitting thyristors L(12) through L(7).

The shifting unit 12a, including the shift thyristor T(6) and coupling transistor Q(6) on the other end (of the +x direction) in the block #1, is adjacent to the shifting unit 12B, including the shift thyristor U(6) and coupling transistor P(6) on the one end (of the −x direction) in the block φ2.

The light emitter 10 includes, in the one end portion thereof (in the −x direction), current limiting resistors R1, R2, and RI, VGK terminal, φ1 terminal, φ2 terminal, GND terminal, and φI terminal. The light emitter 10 includes a power source line 71 supplied with the power source voltage VGK from the VGK terminal, shift signal line 72-1 supplied with the shift signal φ1 from the φ1 terminal, shift signal line 72-2 supplied with the shift signal φ2 from the φ2 terminal, ground lines 73-1 and 73-2 supplied with the ground voltage GND from the GND terminal, and light emission signal line 74 supplied with the light emission signal φI via the current limiting resistor RI from the φI terminal. The φ1 terminal supplied with the shift signal φ1 and the φ2 terminal supplied with the shift signal 42 are common to the blocks φ1 and φ2 and the blocks φ1 and φ2 are thus supplied with the same shift signals 41 and 42. Each of the shift signal lines 72-1 and 72-2, if not differentiated from each other, is representatively referred to as a shift signal line 72, and each of the ground lines 73-1 and 73-2, if not differentiated from each other, is representatively referred to as a ground line 73.

The connection configuration of the light emitter 10 is described with reference to enlarged views. Each of the shift thyristors T and U, if not differentiated from each other, may be simply referred to as a shift thyristor, and the light emitting thyristor L may be simply referred as a light emitting thyristor. Each of the shift thyristor and light emitting thyristor, if not differentiated from each other, may be referred to as a thyristor. Similarly, each of the coupling transistors P and Q, if not differentiated from each other, may be simply referred to as a coupling transistor.

Operation of Shift Thyristor, Light Emitting Thyristor, and Coupling Transistor

The basic operation of the light emitter 10 is described below.

The shift thyristor and light emitting thyristor have an npnp structure. The thyristor includes an n-type cathode K (hereinafter referred to as a cathode K and the same is true of the following expression), p-type gate Gp (p-gate Gp), n-type gate Gn (n-gate Gn), p-type anode A (anode A). Since the p-gate Gp is not used for control in the light emitting thyristor L, the p-gate Gp is not illustrated. These labels are commonly used without differentiating one thyristor from another.

The coupling transistor is an npn bipolar transistor with multi-collectors. The coupling transistor includes a n-type emitter E (emitter E), p-type base B (base B), n-type collectors Cf and Cs (collectors Cf and Cs).

These labels are commonly used without differentiating one thyristor from another and one coupling transistor from another. The same is true of the bipolar transistors forming the thyristor. The thyristor is a combination of an npn bi-polar transistor with a single collector and a pnp bi-polar transistor with a single collector as described below, and the emitter E, base B, and collector C are commonly illustrated in the thyristor.

The thyristor and coupling transistor are manufactured of a group III-V compound semiconductor, such as gallium arsenide GaAs semiconductor. A forward voltage (diffusion potential) Vd of the junction of the compound transistor is 1.5 V and a saturation voltage Vc of the bipolar transistor manufactured of the compound semiconductor is 0.3 V. The ground voltage GND is 0 V and the power source voltage VGK is 3.3 V. The shift signals #1 and φ2 and light emission signal φI have the ground voltage GND (L (low level) of 0 V) or the power source voltage VGK (H (high level) of 3.3 V).

FIGS. 2A and 2B illustrate the operation of the light emitter 10 with reference to the shift thyristor T(1), light emitting thyristor L(1), and coupling transistor Q(1). FIG. 2A is an equivalent circuit diagram of the shift thyristor T(1), light emitting thyristor L(1), and coupling transistor Q(1) and FIG. 2B is a cross-sectional view of the shift thyristor T(1) and coupling transistor Q(1). FIG. 2A also illustrates the shift thyristor T(2).

Referring to FIG. 2A, the shift thyristor T(1) includes a combination an npn bipolar transistor Tr1 (hereinafter referred to as an npn transistor Tr1) and a pnp bipolar transistor Tr2 (hereinafter referred to as a pnp transistor Tr2). The base B of the npn transistor Tr1 is connected to a collector C of the pnp transistor Tr2, and the collector C of the npn transistor Tr1 is connected to a base B of the pnp transistor Tr2. The emitter E of the npn transistor Tr1 is a cathode K of the shift thyristor T(1), the collector C of the npn transistor Tr1 (the base B of the pnp transistor Tr2) is the n-gate Gn of the shift thyristor T(1), the collector C of the pnp transistor Tr2 (the base B of the npn transistor Tr1) is the p-gate Gp of the shift thyristor T(1), and the emitter E of the pnp transistor Tr2 is the anode A of the shift thyristor T(1). The emitter E of the npn transistor Tr1 serving as the cathode K is connected to the ground line 73-1 supplied with the ground voltage GND. The emitter E of the pnp transistor Tr2 serving as the anode A is connected to the shift signal line 72-1 supplied with the shift signal #1. The n-gate Gn is connected to a junction point between the start resistor Rs(1) and power source line resistor Rg(1) connected in series. The other end of the start resistor Rs(1) (the end opposite from the junction point) is connected to the shift signal line 72-2 supplied with the shift signal φ2. The other end of the power source line resistor Rg(1) (the end opposite from the junction point) is connected to the power source line 71 supplied with the power source voltage VGK.

In the coupling transistor Q(1) as an npn transistor, the emitter E is connected to the ground line 73-1 supplied with the ground voltage GND, and the base B is connected to the p-gate Gp of the shift thyristor T(1) (the base B of the npn transistor Tr1 and the collector C of the pnp transistor Tr2). The collector Cf is connected via the coupling resistor Rc and power source line resistor Rg, connected in series, to the power source line 71 supplied with the power source voltage VGK. The junction point between the coupling resistor Rc and power source line resistor Rg is connected to the n-gate Gn of the shift thyristor T(2).

The npn transistor Tr1 and coupling transistor Q(1) in the shift thyristor T(1) form a current mirror circuit. Specifically, a current proportional to a current flowing through the npn transistor Tr1 flows through the coupling transistor Q(1).

The collector Cs of the coupling transistor Q(1) is connected to the n-gate Gn of the light emitting thyristor L(1) while also being connected via the power source line resistor RL to the power source line 71 supplied with the power source voltage VGK. In the light emitting thyristor L(1), the anode A is connected to the light emission signal line 74 and the cathode K is connected to the ground line 73-1 supplied with the ground voltage GND.

The operation of the shift thyristor T(1) is described below. The power source line 71 is first set to the power source voltage VGK (3.3 V), the ground line 73-1 is set to the ground voltage GND (0 V), and the shift signals φ1 and φ2 are at L (0 V). The npn transistor Tr1 and pnp transistor Tr2, forming the shift thyristor T(1), are in the off state. The n-gate Gn of the shift thyristor T(1) is connected to the junction point between the start resistor Rs(1) and power source line resistor Rg(1), which are connected in series. The other end of the start resistor Rs(1) (the end opposite from the junction point) is connected to the shift signal line 72-2 at L (0 V) and the other end of the power source line resistor Rg(1) (the end opposite from the junction point) is connected to the power source line 71 at 3.3 V. The n-gate Gn is at a voltage that results from voltage-dividing the voltage difference (3.3 V) in accordance with a resistance ratio of the start resistor Rs(1) to the power source line resistor Rg(1). If the resistance ratio of the start resistor Rs(1) to the power source line resistor Rg(1) is 1:5, the n-gate Gn is at 0.55 V.

When the shift signal φ1 changes from L (OV) to H (3.3 V), the voltage difference between the emitter E (H: 3.3 V) and the base B (the p-gate Gp) (0.55 V) in the pnp transistor Tr2 in the shift thyristor T(1) is 2.75 V, which is equal to or higher than the forward voltage Vd (1.5 V). The pnp transistor Tr2 thus becomes forward biased, transitioning from the off state to the on state. The collector C of the pnp transistor Tr2 (the base B of the npn transistor Tr1) is at 3.0 V that results from subtracting the saturation voltage Vc (0.3 V) from the voltage of the emitter E (H: 3.3 V). The voltage difference (3.0 V) between the emitter E (0 V) and the base B (3.0 V) in the npn transistor Tr1 is equal to or higher than the forward voltage Vd (1.5 V), and the npn transistor Tr1 is thus forward-biased, transitioning from the off state to the on state. Since the npn transistor Tr1 and pnp transistor Tr2 in the shift thyristor T(1) are turned on, the shift thyristor T(1) transitions from the off state to the on state. The shift thyristor T operation of transitioning from the off state to the on state is also referred to as being turned on. The shift thyristor T operation of transitioning from the on state to the off state is referred to as being turned off.

When the shift thyristor T(1) is turned on, the n-gate Gn in the shift thyristor T(1) changes to the saturation voltage Vc of 0.3 V. The anode A is at a voltage that is determined by the current limiting resistor R1 and the internal resistance of the shift thyristor T(1). The anode A may now be at 1.8 V herein. In other words, if the shift thyristor T(1) is turned on, the shift signal line 72-1 changes from 3.3 V to 1.8 V.

As described above, the shift thyristor T(1) is turned on if the voltage of the n-gate Gn becomes lower than the voltage of the anode A by the forward voltage Vd (1.5 V). The shift thyristor T(1) is turned off if the voltage of the shift signal line 72-1 (the voltage between the anode A and cathode K) becomes lower than 1.8 V. For example, if the anode A is at L (0 V), the voltage between the anode A and cathode K is 0 V and the shift thyristor T(1) is thus turned off. On the other hand, if the voltage of the shift signal line 72-1 (the voltage between the anode A and cathode K) is 1.8 V or higher, the shift thyristor T(1) is kept turned on. Here, 1.8 V is referred to as a sustaining voltage.

The operation of the coupling transistor Q(1) is described below.

When the shift thyristor T(1) is in the off state, the npn transistor Tr1 is also in the off state. The coupling transistor Q(1) is thus in the off state. The emitter E in the coupling transistor Q(1) at this moment is set to the ground voltage GND (0 V). The collector Cf is set to the power source voltage VGK (3.3 V) via the power source line resistor Rg and coupling resistor Rc connected in series. The collector Cs is set to the power source voltage VGK (3.3 V) via the power source line resistor RL.

When the shift thyristor T(1) is turned on, in other words, the npn transistor Tr1 is turned on, the p-gate Gp of the shift thyristor T(1) changes to 3.0 V as described above. Since the base B of the coupling transistor Q(1) is connected to the p-gate Gp of the shift thyristor T(1), the voltage difference between the emitter E and the base B is equal to or higher than the forward voltage Vd (1.5 V), in other words, the coupling transistor Q(1) is forward-biased. The coupling transistor Q(1) transitions from the off state to the on state. The collectors Cf and Cs come to have the saturation voltage Vc (0.3 V). The junction point (the n-gate Gn of the shift thyristor T(2)) between the power source line resistor Rg and coupling resistor Rc is at a voltage that results from dividing a voltage difference (3.0 V) between the voltage of the power source line 71 (3.3 V) and the voltage of the collector Cf (0.3 V) by the power source line resistor Rg and coupling resistor Rc. If the resistance ratio of the power source line resistor Rg to the coupling resistor Rc is 5:1, the junction point (the n-gate Gn of the shift thyristor T(2)) between the power source line resistor Rg and coupling resistor Rc has 0.8 V.

The anode A of the shift thyristor T(2) is connected to the shift signal line 72-2 supplied with the shift signal φ2. Since the shift signal φ2 is at L (0 V), the shift thyristor T(2) is not turned on. However, if the shift signal φ2 changes from L (0 V) to H (3.3 V), the anode A of the shift thyristor T(2) changes from L (0 V) to H (3.3 V), and the anode A of the shift thyristor T(2) changes to H (3.3 V). The voltage difference (2.5 V) from the n-gate Gn (0.8 V) is equal to or higher than the forward voltage Vd (1.5 V). The shift thyristor T(2) is forward-biased and thus turned on. In a shift operation, multiple elements are employed and successively turned on. According to the exemplary embodiments of the disclosure, elements that are turned on or off in the shift operation are referred to as shift elements.

The operation of the light emitting thyristor L(1) is described below.

The collector Cs of the coupling transistor Q(1) is connected to the n-gate Gn of the light emitting thyristor L(1). When the collector Cs of the coupling transistor Q(1) is at the saturation voltage Vc (0.3 V), the n-gate Gn of the light emitting thyristor L(1) has 0.3 V. If the light emission signal φI changes from L (0 V) to H (3.3 V) at this moment, the anode A of the light emitting thyristor L(1) connected to the light emission signal line 74 is at H (3.3 V). In the light emitting thyristor L(1), the voltage difference (3.0 V) between the anode A (H (3.3 V)) and the n-gate Gn (0.3 V) is equal to or higher than the forward voltage Vd (1.5 V). The light emitting thyristor L(1) is thus forward-biased and thus turned on, emitting light. When the coupling transistor Q(1) transitions from the off state to the on state, the n-gate Gn of the light emitting thyristor L(1) is at 0.3 V, thereby being ready to emit light. When the light emission signal φI changes to H (3.3 V), the light emitting thyristor L(1) emits light. In order for the light emitting thyristor L(1) not to emit light (in order to keep the light emitting thyristor L(1) unlit), the light emission signal φI may be maintained at L (0 V).

When the shift thyristor T(1) and light emitting thyristor L(1) are forward-biased with the voltage between the anode A and the n-gate Gn being equal to or higher than the forward voltage Vd (1.5 V), the shift thyristor T(1) and light emitting thyristor L(1) are turned on. When the shift thyristor T(1) transitions from the off state to the on state, the coupling transistor Q(1) transitions from the off state to the on state. The n-gate Gn of the light emitting thyristor L(1) is at the saturation voltage Vc (0.3 V).

As described above, the shift thyristor T(1) is ready to transition to the on state when the ground lines 73 (the ground lines 73-1 and 73-2) are at the ground voltage GND (0 V), the power source line 71 is at the power source voltage VGK, and the shift signal line 72-1 supplied with the shift signal φ1 and the shift signal line 72-2 supplied with the shift signal φ2 are set to L (0 V). This state is referred to as a default state. However, if the shift signal φ1 (of the shift signal line 72-1) is L (0 V) in the default state, the shift thyristor T(1) does not transition to the on state. When the shift signal φ1 (of the shift signal line 72-1) changes from L (0 V) to H (3.3 V), the shift thyristor T(1) transitions from the off state to the on state (is turned on). When the shift thyristor T(1) is turned on, the coupling transistor Q(1) transitions from the off state to the on state. The light emitting thyristor L(1) is ready to emit light. When the coupling transistor Q(1) is in the on state, the shift thyristor T(2) is ready to transition to the on state. However, if the shift signal φ2 (of the shift signal line 72-2) is L (0 V), the shift thyristor T(2) does not transition to the on state. When the shift signal φ1 (of the shift signal line 72-1) changes from H (3.3 V) to L (0 V), the cathode K and anode A have L (0 V), causing the shift thyristor T(1) to be turned off.

Referring to FIG. 2B, the light emitter 10 is manufactured by laminating on an n-type semiconductor substrate 80 an n-type semiconductor layer 81, p-type semiconductor layer 82, n-type semiconductor layer 83, and p-type semiconductor layer 84. The shift thyristor T(1) includes the n-type semiconductor layer 81 as the cathode K, the p-type semiconductor layer 82 as the p-gate Gp, the n-type semiconductor layer 83 as the n-gate Gn, and the p-type semiconductor layer 84 as the anode A. On the other hand, the coupling transistor Q(1) includes the n-type semiconductor layer 81 as the emitter E, the p-type semiconductor layer 82 as the base B, and the n-type semiconductor layer 83 as the collectors Cf and Cs. The cathode K of the shift thyristor T(1) and the emitter E of the coupling transistor Q(1) are electrically connected to each other via the n-type semiconductor layer 81. Similarly, the p-gate Gp of the shift thyristor T(1) and the base B of the coupling transistor Q(1) are electrically connected to each other via the p-type semiconductor layer 82. The n-gate Gn of the shift thyristor T(1) and the collectors Cf and Cs of the coupling transistor Q(1) are manufactured of the same n-type semiconductor layer 83 but separated from each other. The shift thyristor T(1) and coupling transistor Q(1) are configured in this way. The light emitting thyristor L(1) is identical in configuration to the shift thyristor T(1). The other shift thyristors T and U, coupling transistors Q and P and light emitting thyristor L are also identical in configuration to the shift thyristor T(1).

Figures 3A, 3B:
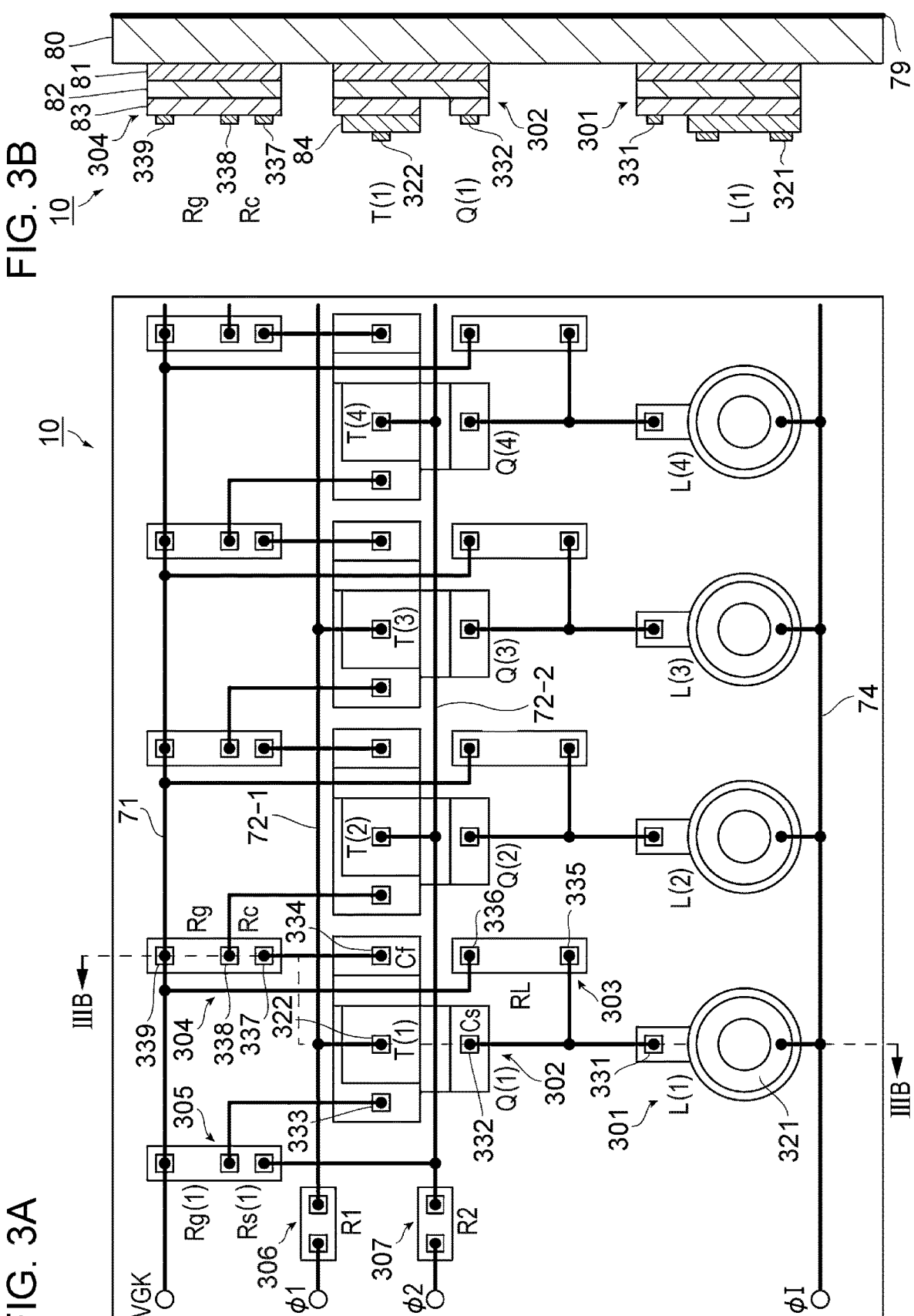

FIGS. 3A and 3B illustrate the layout and cross section of the light emitter 10. FIG. 3A illustrates the layout of the light emitter 10 and FIG. 3B illustrates the cross section of the light emitter 10 taken along line IIIB-IIIB in FIG. 3A. FIG. 3A illustrates a region of light emitting thyristors L(1) through L(4). FIG. 3B is thus the cross-sectional view of a region of the light emitting thyristor L(1), shift thyristor T(1), coupling transistor Q(1), and coupling resistor Rc and power source line resistor Rg connected to the coupling transistor Q(1).

Referring to FIG. 3B, the light emitter 10 is manufactured by laminating, on the n-type semiconductor substrate 80, the n-type semiconductor layer 81, p-type semiconductor layer 82, n-type semiconductor layer 83, and p-type semiconductor layer 84. The elements, such as the shift thyristors T and U, light emitting thyristor L, and coupling transistors Q and P, are formed of multiple islands that are separated by removing part of the semiconductor layers through an etching process. The following discussion focuses on the islands (islands 301 through 307) where the shift thyristor T(1), coupling transistor Q(1), light emitting thyristor L(1) and the like are formed.

The light emitting thyristor L(1) is arranged in the island 301. The shift thyristor T(1) and coupling transistor Q(1) are arranged in the island 302 illustrated in FIG. 2B. The power source line resistor RL is arranged in the island 303, and the power source line resistor Rg and coupling resistor Rc are arranged in the island 304. The power source line resistor Rg(1) and start resistor Rs(1) are arranged in the island 305. The current limiting resistor R1 is arranged in the island 306, and the current limiting resistor R2 is arranged in the island 307.

The layout and cross section of the light emitter 10 are described with reference to FIGS. 3A and 3B.

The n-type semiconductor layer 81, p-type semiconductor layer 82, n-type semiconductor layer 83, and p-type semiconductor layer 84 surrounding the island 301 are removed through an etching process (see FIG. 3B). A p-ohmic electrode 321 likely to be in ohmic contact with the p-type semiconductor is arranged on the p-type semiconductor layer 84. An n-ohmic electrode 331 likely to be in ohmic contact with the n-type semiconductor is arranged on the n-type semiconductor layer 83 that is exposed by removing the p-type semiconductor layer 84. The n-ohmic electrode 331 is the n-gate Gn of the light emitting thyristor L(1).

The n-type semiconductor layer 81, p-type semiconductor layer 82, n-type semiconductor layer 83, and p-type semiconductor layer 84 surrounding the island 302 are removed through the etching process (see FIG. 2B). A p-ohmic electrode 322 is arranged on the p-type semiconductor layer 84. The p-ohmic electrode 322 is an electrode (anode electrode) connected to the anode of the shift thyristor T(1). The p-ohmic electrode 322 is connected to the shift signal line 72-1 supplied with the shift signal #1. Arranged on the n-type semiconductor layer 83 that is exposed by removing the p-type semiconductor layer 84 are n-ohmic electrodes 332, 333, and 334. The n-ohmic electrodes 332 and 334 are electrodes (collector electrodes) connected to the collectors Cf and Cs of the coupling transistor Q1. The n-type semiconductor layer 83 between the p-ohmic electrode 322 and the n-ohmic electrodes 332 and 334 is removed (see FIG. 2B). The n-ohmic electrode 333 is an electrode (n-gate electrode) connected to the n-gate Gn of the shift thyristor T(1).

The semiconductor layers 81 through 84 surrounding the island 303 are removed through the etching process. Two n-ohmic electrodes 335 and 336 are arranged in the island 303 on the n-type semiconductor layer 83 that is exposed by removing the p-type semiconductor layer 84. The n-type semiconductor layer 83 between the two n-ohmic electrodes, namely, n-ohmic electrodes 335 and 336, serves as the power source line resistor RL.

The island 304 is configured in the same way as the island 303. Three n-ohmic electrodes 337, 338, and 339 are arranged on the n-type semiconductor layer 83 that is exposed by removing the p-type semiconductor layer 84. The n-type semiconductor layer 83 between the n-ohmic electrodes 337 and 338 serves as the coupling resistor Rc and the n-type semiconductor layer 83 between the n-ohmic electrodes 338 and 339 serves as the power source line resistor Rg.

The island 305 is configured in the same way as the island 304 and includes the start resistor Rs(1) and power source line resistor Rg(1). The islands 306 and 307 are configured in the same way as the island 303 and includes the current limiting resistors R1 and R2.

A rear-surface electrode 79 supplied with the ground voltage GND is arranged on a rear surface of the n-type semiconductor substrate 80.

Connection configuration is described below. Wirings for connection (the power source line 71, shift signal lines 72-1 and 72-2, and light emission signal line 74) are denoted by straight lines.

The p-ohmic electrode 321 serving as the anode electrode of the light emitting thyristor L(1) in the island 301 is connected to the light emission signal line 74 supplied with the light emission signal φI. The n-ohmic electrode 331 serving as the n gate Gn of the light emitting thyristor L(1) in the island 301 is connected to the n-ohmic electrode 332 serving as the collector electrode of the coupling transistor Q(1) in the island 302. The n-ohmic electrode 332 is connected to the n-ohmic electrode 335 serving as one end of the power source line resistor RL arranged in the island 303. The n-ohmic electrode 336 at the other end of the island 303 is connected to the power source line 71 supplied with the power source voltage VGK.

The p-ohmic electrode 322 serving as the anode electrode of the shift thyristor T(1) in the island 302 is connected to the shift signal line 72-1. The shift signal line 72-1 is connected to the φ1 terminal that is supplied with the shift signal φ1 via the current limiting resistor R1 arranged in the island 306. The n-ohmic electrode 333 serving as an n-gate electrode of the shift thyristor T(1) in the island 302 is connected to an n-ohmic electrode (with no labeling) as the junction point between the power source line resistor Rg(1) and the start resistor Rs(1) arranged in the island 305. The n-ohmic electrode 334 serving as the collector electrode of the coupling transistor Q(1) in the island 302 is connected to the n-ohmic electrode 337 of the coupling resistor Rc in the island 304.

The n-ohmic electrode 338 of the coupling resistor Rc in the island 304 is connected to an n-ohmic electrode (with no labeling) serving as the n-gate electrode of the shift thyristor T(2). The n-ohmic electrode 339 of the power source line resistor Rg in the island 304 is connected to the power source line 71 supplied with the power source voltage VGK.

The n-ohmic electrode (with no labeling) of the start resistor Rs(1) in the island 305 is connected to the shift signal line 72-2 supplied with the shift signal φ2. The n-ohmic electrode (with no labeling) of the power source line resistor Rg(1) in the island 305 is connected to the power source line 71. The shift signal line 72-2 is connected via the current limiting resistor R2 in the island 307 to the φ2 terminal that is supplied with the shift signal φ2.

The shift signal line 72-1 is connected to a p-ohmic electrode as the anode electrode of an odd-numbered shift thyristor T and the shift signal line 72-2 is connected to a p-ohmic electrode as the anode electrode of an even-numbered shift thyristor T.

The other shift thyristors T and U, coupling transistors Q and P, and light emitting thyristors L are respectively identical in configuration to the shift thyristor T(1), coupling transistor Q(1), and light emitting thyristor L(1). The start resistor Rs(2) and power source line resistor Rg(2) are respectively identical in configuration to the start resistor Rs(1) and power source line resistor Rg(1).

As described above, the light emitter 10 is arranged on the semiconductor substrate 80 manufactured of single semiconductor. Specifically, the blocks φ1 and φ2 of the shifting unit 12 are arranged on the n-type semiconductor substrate 80 manufactured of the single semiconductor. The φ1 and φ2 terminals supplied with the shift signals φ1 and φ2 that are to be applied to the shifting unit 12 are arranged on the n-type semiconductor substrate 80 manufactured of the single semiconductor.

FIGS. 4A and 4B are enlarged views illustrating the operation of the light emitter 10. FIG. 4A illustrates one end portion of the light emitter 10 (in an −x direction) and FIG. 4B illustrates the other end portion of the light emitter 10 (in a +x direction). The one end portion of the light emitter 10 (in the −x direction) in FIG. 4A is identical to the end portion of the light emitter 10 in FIG. 2A. The shift thyristor T(1) is denoted by a thyristor symbol and the coupling transistor Q(2) is additionally illustrated. FIG. 4B illustrates, in the other end portion of the light emitter 10 (in the +x direction), shift thyristors U(1) and U(2), coupling transistors P(1) and P(2), light emitting thyristors L(12) and L(11), power source line resistor Rg, coupling resistor Rc, and power source line resistor RL. FIG. 4B further illustrates, in the other end portion (in the +x direction), the power source line resistor Rg(2) and start resistor Rs(2). The shift thyristor T(1), coupling transistor Q(1), and light emitting thyristor L(1) are attached with the anode A, cathode K, n-gate Gn, p-gate Gp, emitter E, base B, and collectors Cf and Cs. Even if portions are not denoted by labels in FIGS. 4A and 4B, the anode A, cathode K, n-gate Gn, p-gate Gp, emitter E, base B, and collector C are used for identification in the following discussion.

FIGS. 4A and 4B illustrate the power source line 71 supplied with the power source voltage VGK, shift signal lines 72-1 and 72-2 respectively supplied with the shift signals φ1 and φ2, ground lines 73 (the ground lines 73-1 and 73-2) supplied with the ground voltage GND, and light emission signal line 74 supplied with the light emission signal φI. Referring to FIGS. 4A and 4B, the one end portion of the light emitter 10 (in the −x direction) is connected to the other end portion of the light emitter 10 (in the +x direction) (as illustrated by broken lines).

Referring to FIG. 3A, in the block φ1 in the one end portion of the light emitter 10 (in the −x direction), the other end of the start resistor Rs(1) (the end opposite from the junction point with the power source line resistor Rg(1)) is connected to the shift signal line 72-2 supplied with the shift signal φ2. The anode A of the shift thyristor T(1) is connected to the shift signal line 72-1 supplied with the shift signal φ1 and the anode A of the shift thyristor T(2) is connected to the shift signal line 72-2 supplied with the shift signal φ2. Referring to FIG. 1B, the shift thyristors T are alternately in numerical order connected to the shift signal line 72-1 or shift signal line 72-2.

In the block φ2 in the other end portion of the light emitter 10 (in the +x direction) illustrated in FIG. 4B, the other end of the start resistor Rs(2) (the end opposite from the junction point with the power source line resistor Rg(2)) is connected to the shift signal line 72-1 supplied with the shift signal #1. The anode A of the shift thyristor U(1) is connected to the shift signal line 72-2 supplied with the shift signal φ2 and the anode A of the shift thyristor U(2) is connected to the shift signal line 72-1 supplied with the shift signal #1. Specifically, referring to FIG. 1B, the anodes A of the shift thyristors U are alternately in numerical order connected to the shift signal line 72-2 or shift signal line 72-1.

Referring to FIG. 2A, if the ground lines 73 (the ground lines 73-1 and 73-2) are set to the ground voltage GND (0 V), the power source line 71 is set to the power source voltage VGK (3.3 V), and the shift signal line 72-1 supplied with the shift signal φ1 and the shift signal line 72-2 supplied with the shift signal φ2 are set to L (0 V), the shift thyristor T(1) is ready to transition to the on state. In the block φ2 in FIG. 4B, as well, the n-gate Gn of the shift thyristor U(1) is supplied with a voltage that results from dividing the voltage difference (3.3 V) between the power source voltage VGK (3.3 V) and the ground voltage GND (0 V) by the power source line resistor Rg(2) and start resistor Rs(2). If the resistance ratio of the power source line resistor Rg(2) to the start resistor Rs(2) is 5:1, the n-gate Gn of the shift thyristor U(1) is at 0.55 V in the same way as the n-gate Gn of the shift thyristor T(1). The shift thyristor U(1) is also ready to transition to the on state in the same way as the shift thyristor T(1). A default state refers to a state in which the ground lines 73 (the ground lines 73-1 and 73-2) are set to the ground voltage GND (0 V), the power source line 71 is set to the power source voltage VGK (3.3 V), and the shift signal line 72-1 supplied with the shift signal φ1 and the shift signal line 72-2 supplied with the shift signal φ2 are set to L (0 V).

If the shift signal φ1 (of the shift signal line 72-1) changes from L (0 V) to H (3.3 V) in the default state, the shift thyristor T(1) with the anode A thereof connected to the shift signal line 72-1 is turned on, thereby transitioning from the off state to the on state. The shift thyristor U(1) ready to transition to the on state has the anode A connected to the shift signal line 72-2 at L (0 V), thereby remaining in the off state without being turned on. With the shift thyristor T(1) turned on, the shift signal φ1 (of the shift signal line 72-1) changes to 1.8 V, the n-gate Gn of the shift thyristor U(1) changes from 0.55 V to 2.05 V. On the other hand, when the shift thyristor T(1) is turned on, the n-gate Gn of the shift thyristor T(2) changes to 0.8 V, ready to transition to the on state.

When the shift signal φ2 (of the shift signal line 72-2) changes from L (0 V) to H (3.3 V), the shift thyristor T(2) is turned on, transitioning from the off state to the on state. The n-gate Gn of the shift thyristor U(1) is at 2.05 V and if the shift signal line 72-2 is at H (3.3 V), the voltage difference (1.25 V) is still lower than the forward voltage Vd (1.5 V). Specifically, the shift thyristor U(1) is not forward-biased. The shift thyristor U(1) is not turned on. When the shift signal φ1 (of the shift signal line 72-1) changes from L (0 V) to H (3.3 V) in this way after the default state, the shift thyristor T(1) in the block φ1 is turned on. Since the shift signals #1 and φ2 switch between L (0 V) and H (3.3 V) in an alternate fashion as illustrated in FIGS. 4A and 4B, the on state is shifted through the shift thyristors T in the block #1.

On the other hand, if the shift signal φ2 (of the shift signal line 72-2) changes from L (0 V) to H (3.3 V), the shift thyristor U(1) with the anode A thereof connected to the shift signal line 72-2 is turned on. As illustrated in FIG. 5 below, the shift signals φ1 and φ2 switch between L (0 V) and H (3.3 V) in an alternate fashion, the on state shifts through the shift thyristors T in the block φ2. The block φ1 and the block φ2 are thus reverse to each other in state. Specifically, the phases of two-phase shift signals φ1 and φ2 select a block to be operated in the shift operation. The shift signals φ1 and φ2 are examples of two-phase or more-phase signals.

Voltage relationship used to operate the block #1 is described below.

When the shift thyristor T(1) transitions from the off state to the on state, the voltage difference between the anode A and the n-gate Gn is 2.75 V. When the shift thyristor T(2) transitions from the off state to the on state, the voltage difference between the anode A and the n-gate Gn is 2.5 V. When the light emitting thyristor L(1) transitions from the off state to the on state, the voltage difference between the anode A and the n-gate Gn is 3.0 V. These values are set to be equal to or higher than the forward voltage Vd (1.5 V), in other words, these elements are forward-biased. On the other hand, after the shift thyristor T(1) is turned on in the block #1, the shift thyristor U(1) in the block φ2 may be set not to be turned on if the shift signal line 72-2 transitions to H (3.3 V). To this end, the voltage difference (1.25 V here) between the n-gate Gn of the shift thyristor U(1) and the shift signal line 72-2 is set to be lower than the forward voltage Vd (1.5 V) if the shift signal line 72-2 transitions to H (3.3 V). These voltage differences may be determined in accordance with the power source voltage VGK, a ratio of the power source line resistor Rg(1) to the start resistor Rs(1), a ratio of the power source line resistor Rg(2) to the start resistor Rs(2), and a ratio of the power source line resistor Rg to the coupling resistor Rc.

FIG. 5 is a timing diagram explaining the operation of the light emitter 10. Horizontal axes represent time and time elapses in the order of time a through time p. FIG. 5 illustrates time changes in the shift signals φ1 and φ2 and the light emission signal φI and thus illustrates the numbers attached to the shift thyristors T and U, and light emitting thyristor L that are in the on state.

The light emitting thyristors L(4) and L(11) are lit in the light emitter 10. After the light emitting thyristor L(4) is lit in the default state, the light emitter 10 reverts back to the default state and the light emitting thyristor L(11) is lit. Any light emitting thyristor L is selected and lit. In other words, the light emitting thyristors L are randomly lit.

Referring to FIG. 1B, the light emitting thyristor L(4) may be lit by transitioning the shift thyristor T(4) in the block φ1 to the on state. The light emitting thyristor L(11) may be lit by transitioning the shift thyristor U(2) in the block φ2 to the on state.

The timing diagram in FIG. 5 is described with reference to FIGS. 1A and 1B.

The light emitter 10 is in the default state prior to time a. As described above, the default state refers to the state in which the ground line 73 (the ground lines 73-1 and 73-2) are set to the ground voltage GND (0 V), the power source line 71 is set to the power source voltage VGK, and the shift signals φ1 and φ2 are set to L (0 V). The shift thyristors T(1) and U(1) are ready to transition to the on state.

When the shift signal φ1 changes from L (0 V) to H (3.3 V) at time a, the shift thyristor T(1) in the block φ1 is turned on, transitioning from the off state to the on state.

When the shift signal φ2 changes from L (0 V) to H (3.3 V) at time b, the shift thyristor T(2) is turned on, transitioning from the off state to the on state.

When the shift signal φ1 changes from H (3.3 V) to L (0 V) at time c, the shift thyristor T(1) is turned off, transitioning from the on state to the off state. The shift thyristors T(1) and T(2) are in the on state from time b to time c.

When the shift signal φ1 changes from L (0 V) to H (3.3 V) at time d, the shift thyristor T(3) is turned on, transitioning from the off state to the on state.

When the shift signal φ2 changes from H (3.3 V) to L (0 V) at time e, the shift thyristor T(2) is turned off, transitioning from the on state to the off state. From time d to time e, the shift thyristors T(2) and T(3) are in the on state.

When the shift signal φ2 changes from L (0 V) to H (3.3 V) at time f, the shift thyristor T(4) is turned on, transitioning from the off state to the on state.

When the shift signal φ1 changes from H (3.3 V) to L (0 V) at time g, the shift thyristor T(3) is turned off, transitioning from the on state to the off state. From time f to time g, the shift thyristors T(3) and T(4) are in the on state. The coupling transistor P(4) connected to the shift thyristor T(4) transitions to the on state and the n-gate Gn of the light emitting thyristor L(4) connected to the collector Cf of the coupling transistor Q(4) changes to 0.3 V.

When the light emission signal φI changes from L (0 V) to H (3.3 V) at time h, the anode A of the light emitting thyristor L(4) changes to H (3.3 V). Since the voltage difference (3.0 V) between the anode A (H (3.3 V)) and the n-gate Gn (0.3 V) is higher than the forward voltage Vd (1.5 V), the light emitting thyristor L(4) is forward-biased, and thus turned on (transitioning from the off state to the on state).

When the light emission signal φI changes from H (3.3 V) to L (0 V) at time i, the light emitting thyristor L(4) is turned off and unlit with the anode A and cathode K thereof having 0 V (transitioning from the on state to the off state).

When the shift signal φ2 changes from H (3.3 V) to L (0 V) at time j, the shift thyristor T(4) transitions from the on state to the off state, reverting back to the default state. In other words, all the shift thyristors T transition to the off state. As previously described, the shift thyristors T(1) and U(1) are ready to transition to the on state.

When the shift signal φ2 changes from L (0 V) to H (3.3 V) at time k, the shift thyristor U(1) in the block φ2 is turned on, transitioning from the off state to the on state.

When the shift signal φ1 changes from L (0 V) to H (3.3 V) at time l, the shift thyristor U(2) is turned on, transitioning from the off state to the on state.

When the shift signal φ2 changes from H (3.3 V) to L (0 V) at time m, the shift thyristor U(1) is turned off, transitioning from the on state to the off state. From time l to time m, the shift thyristors U(1) and U(2) remain in the on state. The coupling transistor P(2) connected to the shift thyristor U(2) transitions to the on state and the n-gate Gn of the light emitting thyristor L(11) connected to the collector Cf of the coupling transistor P(2) changes to 0.3 V.

When the light emission signal φI changes from L (0 V) to H (3.3 V) at time n, the light emitting thyristor L(11) is turned on and lit (transitioning from the off state to the on state) in the same way as the light emitting thyristor L(4) at time h.

When the light emission signal φI changes from H (3.3 V) to L (0 V) at time o, the light emitting thyristor L(11) is turned off and unlit (transitioning from the on state to the off state).

When the shift signal φ1 changes from H (3.3 V) to L (0 V) at time p, the shift thyristor U(2) is turned off, transitioning from the on state to the off state and thus reverting back to the default state. In other words, all the shift thyristors T are in the off state.

As described above, in the shift operation of two adjacent shift thyristors T in the shifting unit 12, the downstream shift thyristor T is turned on after the upstream shift thyristor T is turned on. After that, the upstream shift thyristor T is turned off. In this way, a time duration throughout which the two adjacent shift thyristors T are simultaneously in the on state is arranged and the on state of the shift thyristors T are shifted by changing the shift signal.

In the light emitter 10, the number of switching operations (hereinafter referred to as the number of steps) that switch the shift signals φ1 and φ2 between L (0 V) and H (3.3 V) to light the light emitting thyristor L(4) is "four." On the other hand, the number of steps to light the light emitting thyristor L(11) is "two."

Figure 6:
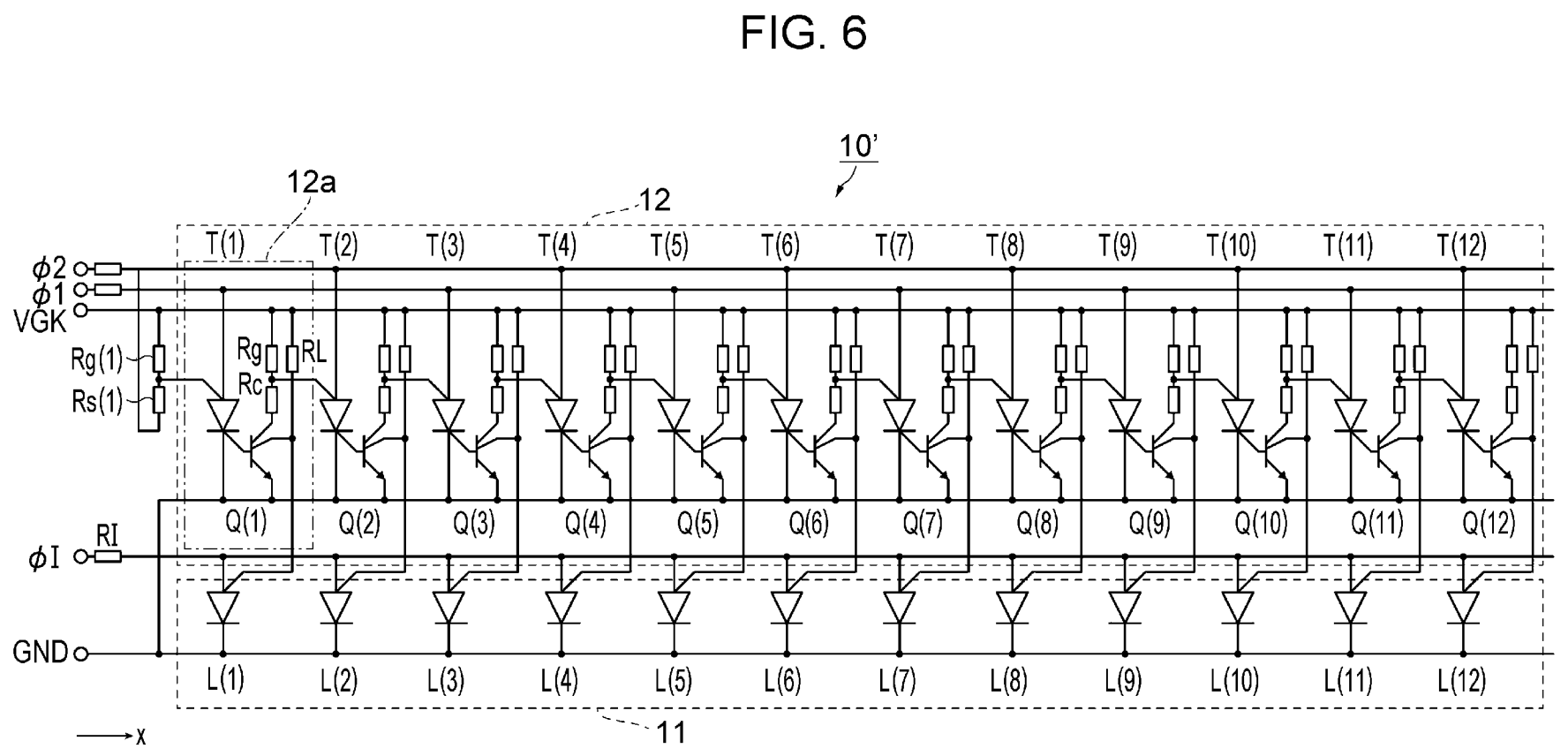

FIG. 6 illustrates an equivalent circuit diagram of a light emitter 10' cited for comparison. The right direction of the page of FIG. 6 is referred to as a +x direction. Elements identical to elements in FIG. 1B are designated with the same reference numerals and the discussion thereof is omitted herein. FIG. 6 illustrates the light emitter 10' that is cited for comparison with the light emitter 10 in the light source device 1 illustrated in FIG. 1A. The light emitter 10' is controlled by the driver 50. The light emitter 10' is also referred to as a light emitter 10' of the related art.

The light emitter 10' includes the light emitting unit 11 and shifting unit 12. The light emitting unit 11 includes the light emitting thyristors L(1) through L(12). The light emitting thyristors L are arranged in one direction (the +x direction). The shifting unit 12 includes the shift thyristors T(1) through T(12) and coupling transistor Q(1) through Q(12). A single shift thyristor T and a single coupling transistor Q form a single shifting unit 12a. The shifting unit 12a further includes the power source line resistor Rg, coupling resistor Rc, and power source line resistor RL. The light emitter 10' includes 12 shifting units 12a from one side (of an −x direction) to the other side (of a +x direction). The light emitter 10' further includes the power source line resistor Rg(1) and start resistor Rs(1) in the one side (of the −x direction). Specifically, the shifting unit 12 in the light emitter 10' is the block φ1 in the shifting unit 12 of the light emitter 10 in FIG. 1B and includes the 12 shifting units 12a, each including the shift thyristor T and coupling transistor Q. The connection configuration of the shift thyristor T, coupling transistor Q and light emitting thyristor L in the light emitter 10' is identical to the connection configuration of the light emitter 10. The operation of the shift thyristor T, coupling transistor Q and light emitting thyristor L in the light emitter 10' is also identical to the operation of the light emitter 10.

Figure 7:
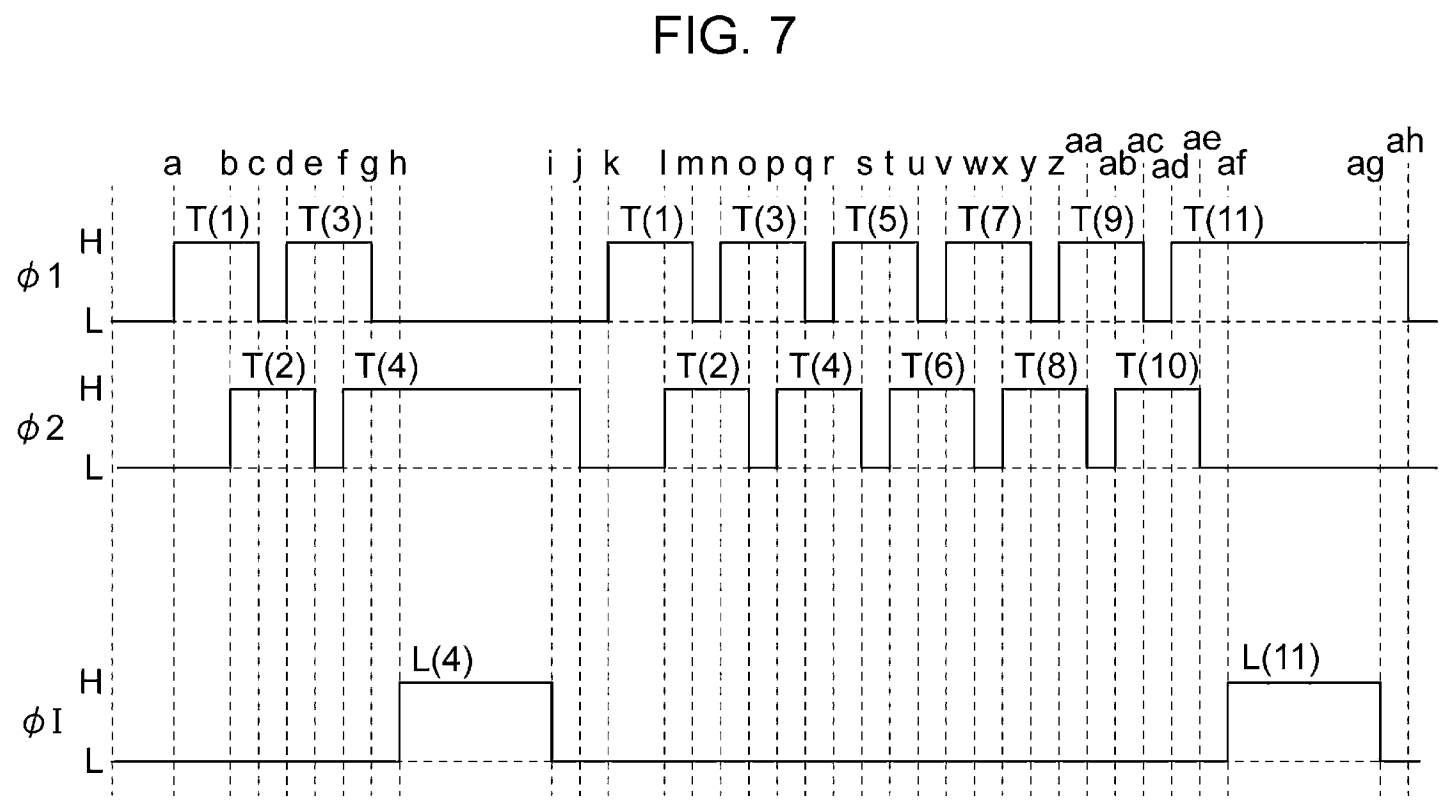

FIG. 7 is a timing diagram illustrating the operation of the light emitter 10' cited for comparison. Horizontal axes represent time and time elapses in the order of time a through time ah. FIG. 7 illustrates time changes in the shift signals φ1 and φ2 and the light emission signal φI and thus illustrates the numbers attached to the shift thyristors T, and light emitting thyristors L that are in the on state.

The light emitting thyristors L(4) and L(11) are also herein lit in the light emitter 10'. After the light emitting thyristor L(4) is lit, the light emitter 10 reverts back to the default state and the light emitting thyristor L(11) is lit.

Referring to FIG. 6, the light emitting thyristor L(4) may be lit by transitioning the shift thyristor T(4) to the on state. The light emitting thyristor L(11) may be lit by transitioning the shift thyristor T(11) to the on state.

The timing diagram in FIG. 7 is described with reference to FIG. 6.

The light emitter 10' is in the default state prior to time a. From time a to time k, the timing diagram in FIG. 7 is identical to the timing diagram in FIG. 5. Specifically, from time a to time g, the on state shifts from the shift thyristor T(1) to the shift thyristor T(4). With the shift thyristor T(4) in the on state at time h, the light emission signal φI changes from L (0 V) to H (3.3 V), and the light emitting thyristor L(4) is turned on and lit. When the light emission signal φI changes from H (3.3 V) to L (0 V) at time i, the light emitting thyristor L(4) is turned off and unlit. When the shift signal φ2 changes from H (3.3 V) to L (0 V) at time j, the shift thyristor T(4) is turned off, transitioning from the on state to the off state and thus reverting back to the default state.

When the shift signal φ1 changes from L (0 V) to H (3.3 V) at time k, the shift thyristor T(1) is turned on, transitioning from the off state to the on state. During a time duration from time k to time af, the on state shifts from the shift thyristor T(1) to the shift thyristor T(11). When the light emission signal φI changes from L (0 V) to H (3.3 V) at time af at which the shift thyristor T(11) is in the on state, the light emitting thyristor L(11) is turned on and lit. When the light emission signal φI changes from H (3.3 V) to L (0 V) at time ag, the light emitting thyristor L(11) is turned off and unlit. When the shift signal φ1 changes from H (3.3 V) to L (0 V) at time ah, the shift thyristor T(11) is turned off, transitioning from the on state to the off state and thus reverting back to the default state.

Referring to FIG. 7, the number of steps to cause the light emitting thyristor L(4) to light is "four" in the light emitter 10'. On the other hand, the number of steps to cause the light emitting thyristor L(11) to light is "11." The light emitter 10 and the light emitter 10' have the same number of steps "four" to cause the light emitting thyristor L(4) to light. However, the number of steps to cause the light emitting thyristor L(11) is "two" in the light emitter 10 while the number of steps to cause the light emitting thyristor L(11) in the light emitter 10' is "11." The light emitter 10 and the light emitter 10' are very different in the number of times to cause the light emitting thyristor L(11) to light. Specifically, time until the light emitting unit 11 is lit, in other words, time to complete the shifting is shortened.

A light emitting thyristor L(n) may now be lit (n is an integer falling within a range of 1 to 12) with the number of light emitting thyristors L being 12. With the range of n≤6, the light emitter 10 of the first exemplary embodiment and the light emitter 10' of the related art have the same number of steps, namely, "n." With the range n≥7, the number of steps in the light emitter 10' of the related art is "n" while the number of steps in the light emitter 10 of the first exemplary embodiment is "13−n." Specifically, with the number of light emitting thyristors L being 12, the light emitter 10' of the related art has the maximum number of steps is "12" while the light emitter 10 of the first exemplary embodiment has half the maximum number of steps of the light emitter 10', namely, "six." Time to perform the shift operation to set the light emitting thyristors L to be lit is almost halved.

The light emitter 10 includes the shifting unit 12 including the two blocks, namely, the blocks φ1 and φ2. The number of shift signal lines 72 in the light emitter 10 illustrated in FIG. 1B is two, namely, equal to the number of shift signal lines in the light emitter 10' of the related art illustrated in FIG. 6. In the light emitter 10, an increase in the number of shift signal lines 72 is controlled while the time to perform the shift operation is set to be shorter than the time to perform the shift operation in the light emitter 10' of the related art.

The shift thyristor T(1) serves as a starting point of the shift operation in the block φ1 and the shift thyristor U(1) serves as a starting point of the shift operation in the block φ2. The starting point is different on a per block basis in the light emitter 10.

The number of light emitting thyristors L (light emitting points) in the light emitter 10 in FIGS. 1A and 1B is 12 but the number of light emitting thyristors L may not necessarily be 12. The number of light emitting thyristors L (light emitting points) included in each of the blocks #1 and φ2 in the light emitter 10 is six but may not necessarily be six. The blocks φ1 and φ2 may be different in the number of light emitting thyristors L (light emitting points).

In the light source device 1 of the first exemplary embodiment in FIGS. 1A and 1B, the on state shifts through the shift thyristors T from the one end (of the −x direction) to the central portion in the block φ1 and the on state shifts through the shift thyristors U from the other end (of the +x direction) to the central portion in the block φ2. Alternatively, the on state may shift from the central portion to the one end (of the −x direction) in the block φ1 and the on state may shift from the central portion to the other end (of the +x direction) in the block φ2.

When the light emitting thyristor L(6) downstream of the light emitting thyristor L(4) is to be lit in the block φ1 after the light emitting thyristor L(4) is lit, the shift operation may proceed to cause the light emitting thyristor L(6) to light instead of reverting back to the default state after the light emitting thyristor L(4) is lit. The same is true of the block φ2.

Other blocks may be arranged in parallel with the blocks φ1 and φ2 in the light emitter 10 and lit in parallel with the blocks φ1 and φ2.

In the timing diagram in FIG. 5, after the light emitting thyristor L(4) is lit at time h, the shift signal φ2 may change from H (3.3 V) to L (0 V), turning off the shift thyristor T(4). In this way, the power consumption of the shifting unit 12 may be reduced. The same is true of the other exemplary embodiments.

Second Exemplary Embodiment

The light emitter 10 in the light source device 1 of the first exemplary embodiment includes the shifting unit 12 having the blocks (the blocks φ1 and φ2) different in the starting point of the shift operation. A light emitter 20 in a light source device 2 of a second exemplary embodiment includes a shifting unit 22 having blocks sharing the starting point of the shift operation.

Figures 8A, 8B:
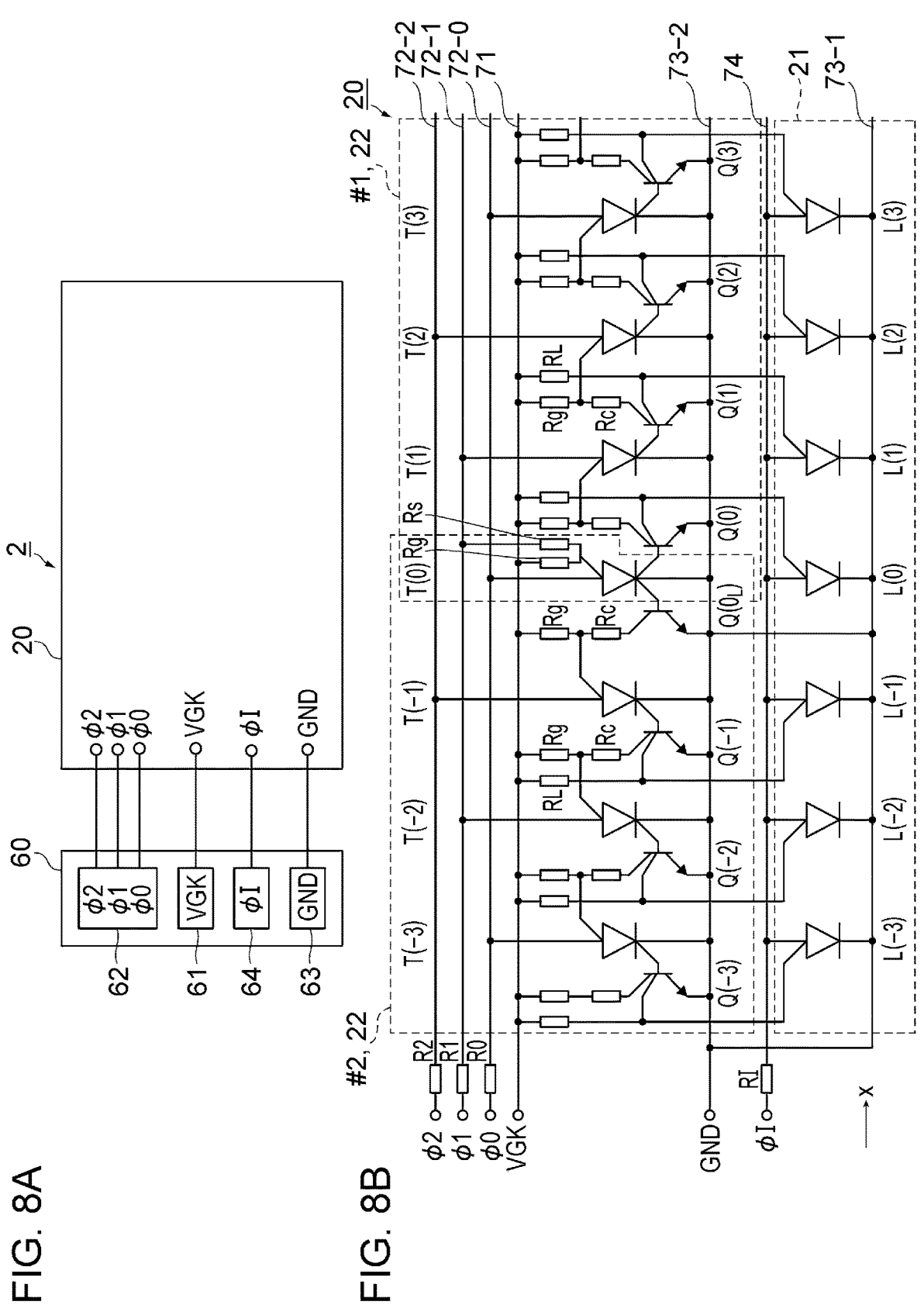

FIGS. 8A and 8B illustrate the light source device 2 of the second exemplary embodiment. FIG. 8A illustrates a configuration of the light source device 2 and FIG. 8B is an equivalent circuit diagram of the light emitter 20 included in the light source device 2. Referring to FIG. 8B, the rightward direction of the page represents the +x direction. Thyristors and transistors are denoted by symbols and resistors are denoted by rectangles. Elements identical to the elements in the first exemplary embodiment are designated with the same reference numerals and the discussion thereof is omitted herein.

The light source device 2 illustrated in FIG. 8A includes the light emitter 20 and driver 60. The driver 60 includes a power source voltage supplier 61, shift signal supplier 62, ground voltage supplier 63, and emission signal supplier 64, and controls the light emitter 20. The light emitter 20 includes a VGK terminal, φ0 terminal, φ1 terminal, φ2 terminal, GND terminal, and φI terminal. The light source device 2 is different from the light source device 1 of the first exemplary embodiment in that the light source device 2 uses three shift signals (shift signals φ0, #1, and φ2).

Light Source Device 2

The power source voltage supplier 61 in the driver 60 supplies the power source voltage VGK to the VGK terminal of the light emitter 20. The shift signal supplier 62 in the driver 60 supplies the shift signals φ0, #1, and φ2 respectively to a φ0 terminal, φ1 terminal, and φ2 terminal of the light emitter 20. The ground voltage supplier 63 in the driver 60 supplies the ground voltage GND to the GND terminal of the light emitter 20. The emission signal supplier 64 in the driver 60 supplies the light emission signal φI to the φI terminal of the light emitter 20. The shift signals φ0, #1, and φ2 are supplied to the shifting unit 22 illustrated in FIG. 8B and successively shifts the on state across the shift thyristors T.

Light Emitter 20

The light emitter 20 includes a light emitting unit 21 and shifting unit 22. The shifting unit 22 is divided into two blocks, namely, the blocks φ1 and φ2. Referring to FIG. 8B, the two blocks are respectively referred to as block #1(22) and block φ2(22).

The light emitting unit 21 includes seven light emitting thyristors L(−3) through L(3). The light emitting thyristors L(−3) through L(3) are arranged from one end (of the −x direction) to the other end (of +x direction).

The block φ1 of the shifting unit 22 includes shift thyristors T(0) through T(3) and coupling transistors Q(0) through Q(3). The shift thyristors T(0) through T(3) and coupling transistors Q(0) through Q(3) are arranged from the central portion to the other end (of the +x direction). On the other hand, the block φ2 includes shift thyristors T(0) through T(−3), a coupling transistor Q(0$_L$), and coupling transistors Q(−1) through Q(−3) from the central portion to the one end (of the −x direction). The shift thyristor T(0) is shared by the block φ1 and block φ2.

The coupling transistors Q(−3) through Q(3) are npn transistors having double collectors. The connection configuration of the shift thyristors T(−3) through T(3), the coupling transistors Q(−3) through Q(3), and the light emitting thyristors L(−3) through L(3) is identical to the connection configuration in the first exemplary embodiment.

The coupling transistor $Q(0_L)$ is an npn transistor having a single collector. The emitter E of the coupling transistor $Q(0_L)$ is connected to the ground line 73–2 supplied with the ground voltage GND and the base B of the coupling transistor $Q(0_L)$ is connected to the p-gate Gp of the shift thyristor T(0). The collector C of the coupling transistor $Q(0_L)$ is connected via the coupling resistor Rc and power source line resistor Rg to the power source line 71 supplied with the power source voltage VGK. The junction point between the coupling resistor Rc and power source line resistor Rg is connected to the n-gate Gn of the shift thyristor T(−1).

The connection configuration of the shift thyristors T(1) through T(3), coupling transistor Q(1) through Q(3), and light emitting thyristor L(1) through L(3) and the connection configuration of the shift thyristors T(−1) through T(−3), coupling transistors Q(−1) through Q(−3), and light emitting thyristors L(−1) through L(−3) are symmetrically arranged with respect to the shift thyristor T(0) except the connection with the shift signal lines 72-0, 72-1, and 72-3.

The anode A (see FIG. 2A) of the shift thyristor T(0) is connected to the shift signal line 72-0 supplied with the shift signal $\phi 0$, and the n-gate Gn of the shift thyristor T(0) is connected via the start resistor Rs to the shift signal line 72-1 supplied with the shift signal #1. The anode A of the shift thyristor T(1) is connected to the shift signal line 72-1 supplied with the shift signal #1. The anode A of The shift thyristor T(2) is connected to the shift signal line 72-2 supplied with the shift signal $\phi 2$. The anode A of the shift thyristor T(3) is connected to the shift signal line 72-0 supplied with the shift signal $\phi 0$. With p≥0 (p is an integer), the shift thyristor T is connected to the shift signal line 72-$q$ wherein q=Mod (p, 3) holds. With p≤−1, the shift thyristor T is also connected to the shift signal line 72-$q$ wherein q=Mod (p, 3) holds. Mod (a, b) represents a remainder system of a-modulo-b. In other words, in the case of the shift signal line 72-$q$, the anode A of the shift thyristor T with a positive p (p=1, 2, and 3) is cyclically connected to the shift signal line 72-$m$ (m=1, 2, and 0). The anode A of the shift thyristor T with a negative p (p=−1, −2, and −3) is reverse-cyclically connected to the shift signal line 72-$m$ (m=2, 1, and 0). Even when the number of the shift thyristor T is other than the numbers described above, the same connection method is applicable. If the number q attached to the shift signal line 72 connected to the anode A of the shift thyristor T(0) is different, the anode A of the shift thyristor T with a positive p (p=1, 2, and 3) is connected to the shift signal lines 72, with the connection starting with the shift signal line 72 having a number succeeding to q in a cyclic sequence and the anode A of the shift thyristor T with a negative p (p=−1, −2, and −3) is connected to the shift signal lines 72, with the connection starting with the shift signal line 72 having a number succeeding to q in a reverse cyclic sequence.

Operation of Light Emitter 20

Figure 9:
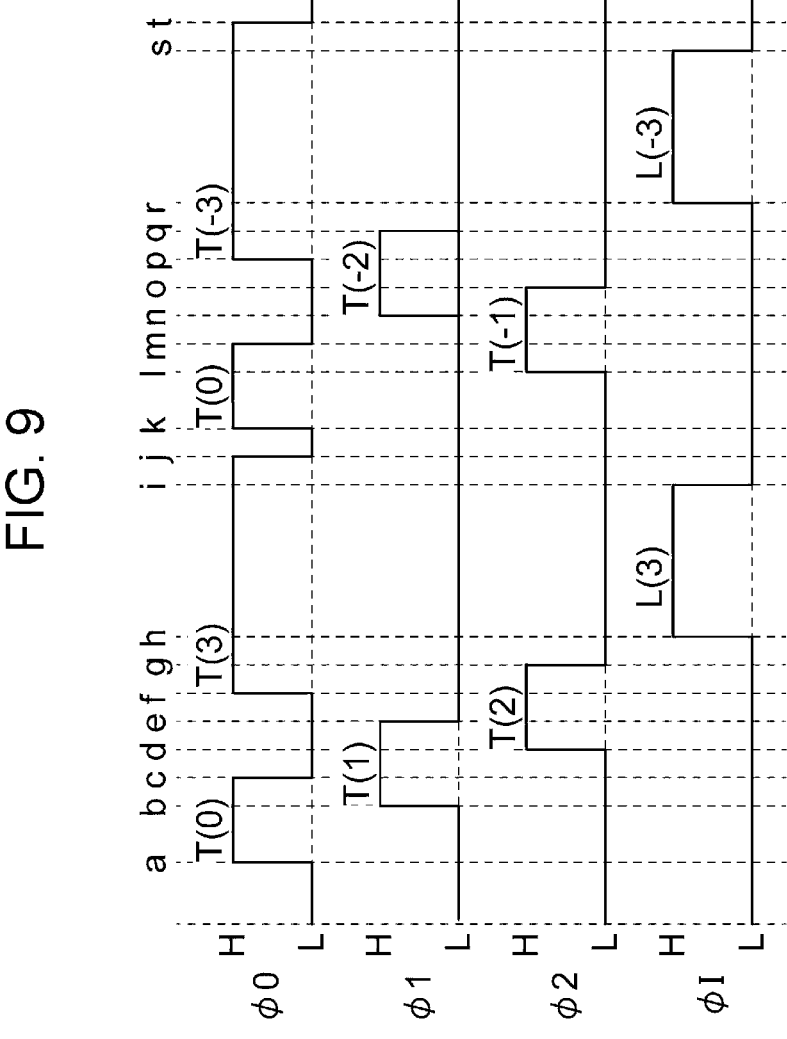
FIG. 9 is a timing diagram illustrating the operation of the light emitter.

FIG. 9 is a timing diagram illustrating the operation of the light emitter 20. Horizontal axes represent time, and time a through time t elapse in this order. FIG. 9 illustrates time changes in the shift signals $\phi 0$, #1, and $\phi 2$ and light emission signal $\phi I$. Referring to FIG. 9, the numbers attached to the shift thyristors T and light emitting thyristors L that are in the on state are illustrated.

The light emitting thyristor L(3) and light emitting thyristor L(−3) in the light emitter 20 may now be lit. After the light emitting thyristor L(3) is lit in the default state, the light emitter 20 reverts back to the default state and then the light emitting thyristor L(−3) is lit. Any light emitting thyristors L may be selected and lit. In other words, the light emitting thyristors L may be randomly lit.

Referring to FIG. 8B, the light emitting thyristor L(3) may be lit by transitioning the shift thyristor T(3) in the block $\phi 1$ to the on state. The light emitting thyristor L(−3) may be lit by transitioning the shift thyristor T(−3) in the block $\phi 2$ to the on state.

The timing diagram in FIG. 9 is described with reference to FIGS. 8A and 8B.

The light emitter 20 is in the default state prior to time a. The default state refers to the state in which the ground line 73 (the ground lines 73–1 and 73 –2) are set to the ground voltage GND (0 V), the power source line 71 is set to the power source voltage VGK, and the shift signals $\phi 0$, $\phi 1$ and $\phi 2$ are set to L (0 V). The shift thyristors T(0) with the n-gate Gn at 0.55 V is ready to transition to the on state.

When the shift signal $\phi 0$ changes from L (0 V) to H (3.3 V) at time a, the shift thyristor T(0) is turned on, transitioning from the off state to the on state. The coupling transistor Q(0) and coupling transistor $Q(0_L)$ transition to the on state. The n-gate Gn of the shift thyristor T(1) connected to the collector Cf of the coupling transistor Q(0) via the coupling resistor Rc changes to 0.8 V. Similarly, the n-gate Gn of the shift thyristor T(−1) connected to the collector Cf of the coupling transistor $Q(0_L)$ via the coupling resistor Rc changes to 0.8 V. Specifically, both the shift thyristor T(1) and the shift thyristor T(−1) are ready to transition to the on state.

When the shift signal $\phi 1$ changes from L (0 V) to H (3.3 V) at time b, the shift thyristor T(1) with the anode A connected to the shift signal line 72-1 supplied with the shift signal $\phi 1$ is turned on, transitioning from the off state to the on state. On the other hand, if the shift thyristor T(−1) with the anode A connected to the shift signal line 72-2 supplied with the shift signal $\phi 2$ at L (0 V) is not turned on. The shift thyristor T(2) with the n-gate Gn (0.8 V) connected via the coupling transistor Q(1) to the shift thyristor T(1) is ready to transition to the on state.

When the shift signal $\phi 0$ changes from H (3.3 V) to L (0 V) at time c, the shift thyristor T(0) is turned off, transitioning from the on state to the off state. In response, the coupling transistor Q(0) and coupling transistor $Q(0_L)$, connected to the shift thyristor T(0), transition from the on state to the off state. The n-gate Gn of the shift thyristor T(−1) has a voltage of the power source line 71 supplied with the power source voltage VGK (3.3 V). From time b to time c, the shift thyristors T(0) and T(1) are in the on state.

When the shift signal $\phi 2$ changes from L (0 V) to H (3.3 V) at time d, the shift thyristor T(2) is turned on, transitioning from the off state to the on state. At this moment, the anode A of the shift thyristor T(−1) is connected to the shift signal line 72-2 that has changed to H (3.3 V) but since the n-gate Gn is 3.3 V, the shift thyristor T(−1) is not turned on.

When the shift signal $\phi 1$ changes from H (3.3 V) to L (0 V) at time e, the shift thyristor T(1) is turned off, transitioning from the on state to the off state. From time d to time e, the shift thyristors T(1) and T(2) are in the on state.

When the shift signal 40 changes from L (0 V) to H (3.3 V) at time f, the shift thyristor T(3) is turned on, transitioning from the off state to the on state.

When the shift signal 42 changes from H (3.3 V) to L (0 V) at time g, the shift thyristor T(2) is turned off, transitioning from the on state to the off state. From time f to time g, the shift thyristors T(2) and T(3) are in the on state. The coupling transistor Q(3) connected to the shift thyristor T(3) transitions to the on state and the n-gate Gn of the light emitting thyristor L(3) connected to the collector Cf of the coupling transistor Q(3) changes to 0.3 V.

When the light emission signal φI changes from L (0 V) to H (3.3 V) at time h, the anode A of the light emitting thyristor L(3) changes to H (3.3 V). Since the voltage difference (3.0 V) between the anode A (H (3.3 V)) and the n-gate Gn (0.3 V) is higher than the forward voltage Vd (1.5 V), the light emitting thyristor L(3) is forward-biased, and thus turned on (transitioning from the off state to the on state).

When the light emission signal φI changes from H (3.3 V) to L (0 V) at time i, the light emitting thyristor L(3) is turned off and unlit with the anode A and cathode K thereof changed to 0 V (transitioning from the on state to the off state).

When the shift signal φ0 changes from H (3.3 V) to L (0 V) at time j, the shift thyristor T(3) transitions from the on state to the off state, reverting back to the default state. In other words, all the shift thyristors T transition to the off state. The light emitting thyristor L(0) is ready to transition to the on state.

When the shift signal φ0 changes from L (0 V) to H (3.3 V) at time k, both the shift thyristor T(1) in the block φ1 and the shift thyristor T(−1) in the block φ2 are ready to transition to the on state.

When the shift signal φ2 changes from L (0 V) to H (3.3 V) at time l, the shift thyristor T(−1) is turned on, transitioning from the off state to the on state. The coupling transistor Q(−1) connected to the shift thyristor T(−1) is turned on, causing the shift thyristor T(−2) to be ready to transition to the on state.

When the shift signal φ0 changes from H (3.3 V) to L (0 V) at time m, the shift thyristor T(0) is turned off, transitioning from the on state to the off state. From time l to time m, the shift thyristors T(0) and T(−1) remain in the on state.

When the shift signal φ1 changes from L (0 V) to H (3.3 V) at time n, the shift thyristor T(−2) is turned on, transitioning from the off state to the on state. The coupling transistor Q(−2) connected to the shift thyristor T(−2) is turned on, causing the shift thyristor T(−3) to be ready to transition to the on state.

When the shift signal φ2 changes from H (3.3 V) to L (0 V) at time o, the shift thyristor T(−1) is turned off.

When the shift signal φ0 changes from L (0 V) to H (3.3 V) at time p, the shift thyristor T(−3) is turned on, transitioning from the off state to the on state. At this moment, the coupling transistor Q(3) connected to the shift thyristor T(3) is turned on, and the n-gate Gn of the light emitting thyristor L(−3) connected to the collector Cf of the coupling transistor Q(−3) changes to 0.3 V.

When the shift signal φ1 changes from H (3.3 V) to L (0 V) at time q, the shift thyristor T(−2) is turned off.

When the light emission signal φI changes from L (0 V) to H (3.3 V) at time r, the anode A of the light emitting thyristor L(−3) changes to H (3.3 V). The voltage difference (3.0 V) between the anode A (H (3.3 V)) and the n-gate Gn (0.3 V) is equal to or higher than the forward voltage Vd (1.5 V). The light emitting thyristor L(−3) is thus forward-biased, turned on, and lit (transitioning from the off state to the on state).

When the light emission signal φI changes from H (3.3 V) to L (0 V) at time s, the anode A and the cathode K of the light emitting thyristor L(−3) change to 0 V. The light emitting thyristor L(−3) is turned off and unlit (transitioning from the on state to the off state).

When the shift signal φ0 changes from H (3.3 V) to L (0 V) at time t, the shift thyristor T(−3) transitions from the on state to the off state, reverting back to the default state. Specifically, all the shift thyristors T are in the off state.

As described above, if the shift signal φ1 applied to the anode A of the shift thyristor T(1) changes from L (0 V) to H (3.3 V) after the shift signal φ0 applied to the anode A of the shift thyristor T(0) changes from L (0 V) to H (3.3 V), causing the shift thyristor T(0) to transition to the on state, the on state shifts through the shift thyristors T(0), T(1), T(2), . . . in this order. On the other hand, if the shift signal φ2 applied to the anode A of the shift thyristor T(−1) changes from L (0 V) to H (3.3 V) after the shift signal φ0 applied to the anode A of the shift thyristor T(0) changes from L (0 V) to H (3.3 V), causing the shift thyristor T(0) transition to the on state, the on state shifts through the shift thyristors T(0), T(−1), T(−2), . . . in this order. In other words, the direction of the shift operation is determined based on whether the shift signal φ1 or the shift signal φ2 is set to H (3.3 V) after the shift signal φ0 is set to H (3.3 V). Specifically, the shift direction is specified by the phases of the three-phase shift signals φ0, #1, and φ2.

If a light emitting thyristor L(p) in the light emitter 20 is lit with the number of light emitting thyristors L being seven (p is an integer within a range from −3 to 3), the number of steps is (p+1). In other words, if the number of light emitting thyristors L is seven, the maximum number of steps is "seven" in the light emitter 10' of the related art in FIG. 6 and the maximum number of steps in the light emitter 20 of the second exemplary embodiment is "four." In the light emitter 20, time used to perform the shift operation to cause the light emitting thyristors L to light is almost halved.

The light emitter 20 includes the shifting unit 22 having the two blocks, namely, the blocks φ1 and φ2. The number of shift signal lines 72 in the light emitter 20 illustrated in FIG. 9B is three and thus increased from the two shift signal lines 72 in the light emitter 10' of the related art illustrated in FIG. 6. However, in comparison with the case in which the four shift signal lines 72 are used with the shift signal lines 72 individually employed for the two blocks (the blocks φ1 and φ2), an increase in the number of shift signal lines 72 is controlled while the time to perform the shift operation is set to be shorter than in the light emitter 10' of the related art.

The shift thyristor T(0) serves as a starting point of the shift operation in the block φ1 and the shift thyristor T(0) serves as a starting point of the shift operation in the block φ2. The blocks φ1 and φ2 thus share the starting point in the light emitter 10 of the second exemplary embodiment.

The number of light emitting thyristors L (light emitting points) in the light emitter 20 illustrated in FIGS. 8A and 8B is seven but alternatively, the number of light emitting thyristors L may be other than seven. The number of light emitting thyristors L (light emitting points) in each of the blocks φ1 and φ2 is four, but alternatively, the number of light emitting thyristors L in each of the blocks φ1 and φ2 may be other than four. The number of light emitting thyristors L in the block φ1 may be different from the number of light emitting thyristors L in the block φ2.

Third Exemplary Embodiment

The light emitter 20 in the light source device 2 of the second exemplary embodiment includes the two shifting units 12 having the blocks (the blocks φ1 and φ2) sharing the starting point of the shift operation. A light emitter 30 in a light source device 3 of a third exemplary embodiment includes multiple configurations in the same way as the light emitter 20. The configuration identical to the light emitter 20 is referred to as the light emitter 20 and a portion different from the light emitter 20 is described.

Figure 10:
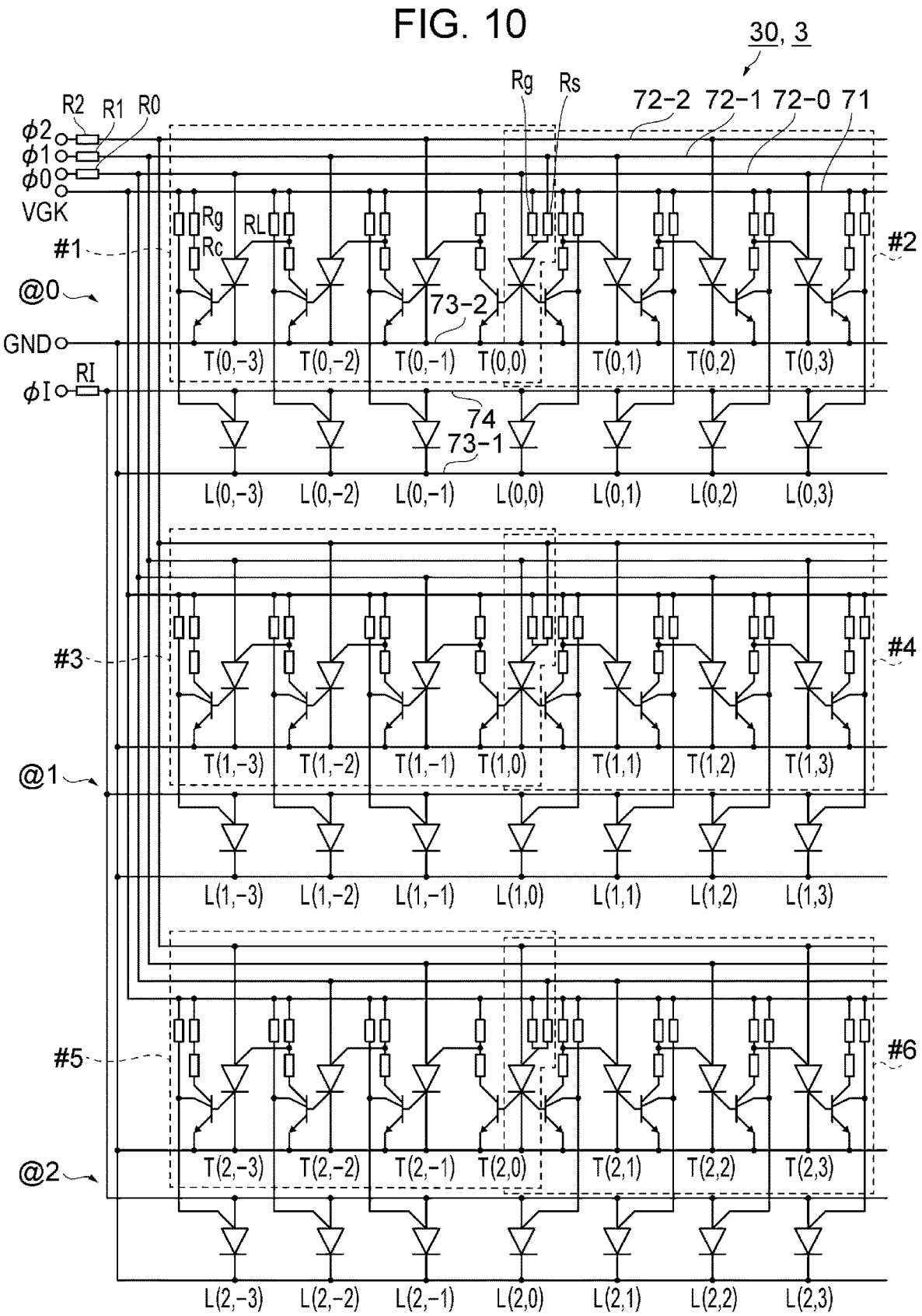
FIG. 10 is an equivalent circuit diagram of a light emitter of a third exemplary embodiment.

FIG. 10 illustrates an equivalent circuit of the light emitter 30 of the third exemplary embodiment. The light source device 3 including the light emitter 30 is configured such that the light emitter 20 in the light source device 2 illustrated in FIG. 8 is replaced with the light emitter 30. Specifically, like the light source device 2, the light source device 3 includes the driver 60. Referring to FIG. 10, the light source device 3 is not illustrated and the light emitter 30 also represents the light source device 3. In the following discussion, labels of the cathode K, anode A, n-gate Gn, and p-gate Gp of the shift thyristor T and light emitting thyristor L are omitted in FIG. 10 and reference is made to FIGS. 2 and 4 for those labels.

Light Emitter 30

The light emitter 30 includes, for example, three light emitters 20. Each light emitter 20 is represented by a block group (block group @0, @1, or @2). As described below, the block group is different in connection configuration from the shift signal lines 72-0, 72-1, and 72-2. As described with reference to the light emitter 20 (see FIG. 8B), a light emitting unit (see the light emitting unit 21 in FIG. 8B) includes seven light emitting thyristors L. Each of the block groups @0, @1, and @2 includes seven shift thyristors T and eight coupling transistors Q in the shifting unit (see the shifting unit 22 in FIG. 8B). Referring to FIG. 10, the light emitting thyristor L is denoted by L(n, p), and the shift thyristor T is denoted by T(n, p). Herein, n represent the numbers 0, 1, and 2 respectively attached to the block groups @, and p represents the numbers respectively attached to the elements (the light emitting thyristor L and the shift thyristor T) in each block group @. The block group @0 is the light emitter 20 illustrated in FIG. 8B. In the block group @0, the light emitting thyristor L(0) in the light emitter 20 is the light emitting thyristor L(0, 0), the light emitting thyristor L(1) is a light emitting thyristor L(0, 1), and the light emitting thyristor L(-1) is the light emitting thyristor L(0, -1). The same is true of the other light emitting thyristors L, shift thyristors T, and other block groups @1 and @2. The coupling transistors Q are not denoted by respective reference numerals.

The shifting unit in each block group includes two blocks. The block group @0 includes the blocks φ1 and φ2, the block group @1 includes blocks #3 and #4, and the block group @2 includes blocks #5 and #6.

Although the block groups @0 through @2 are arranged in the vertical direction of the page of FIG. 10, the connection configuration of wiring is in a parallel configuration. The block groups @0 through @2 may be arranged in the lateral direction of the page of FIG. 10.

The connection configuration of the block groups @0, @1, and @2 with the shift signal lines 72-0, 72-1, and 72-2 is described below. The anode A (see FIG. 3A) of the shift thyristor T(n, 0) is connected to the shift signal line 72-n. The n-gate Gn of the shift thyristor T(n, 0) is connected via the start resistor Rs to the shift signal line 72-m. The relationship of m=Mod (n+1, 3) holds true. Specifically, the anode A of the shift thyristor T(0, 0) is connected to the shift signal line 72-0 and the n-gate Gn of the shift thyristor T(0, 0) is connected to the shift signal line 72-1 via the start resistor Rs. The anode A of the shift thyristor T(1, 0) is connected to the shift signal line 72-1 and the n-gate Gn of the shift thyristor T(1, 0) is connected to the shift signal line 72-2 via the start resistor Rs. The anode A of the shift thyristor T(2, 0) is connected to the shift signal line 72-2 and the n-gate Gn of the shift thyristor T(0, 0) is connected to the shift signal line 72-0 via the start resistor Rs.

The anode A of a shift thyristor T(n, p) attached with the number p in a block group @n is connected to a shift signal line 72-q supplied with a shift signal φq wherein relationship q=Mod (n+p, 3) holds true. For example, the anode A of the shift thyristor T(0, 1) is connected to the shift signal line 72-1. The anode A of the shift thyristors T(1, 2) is connected to the shift signal line 72-0. The anode A of the shift thyristor T(2, -1) is connected to the shift signal line 72-1. In other words, in the case of the shift signal line 72-q, the anode A of the shift thyristor T(0, p) belonging to the block group @0 with a positive p (p=1, 2, or 3) is cyclically connected to the shift signal line 72-q (q=1, 2, or 0). Further in the block group @0, the anode A of the shift thyristor T(0, p) with a negative p (p=-1, -2, or -3) is reverse-cyclically connected to the shift signal line 72-q (q=2, 1, or 0). The anode A of the shift thyristor T(1, p) belonging to the block group @1 with a positive p (p=1, 2, or 3) is cyclically connected to the shift signal line 72-q (q=2, 0, 1). Further in the block group @1, the anode A of the shift thyristor T(1, p) with a negative p (p=-1, -2, or -3) is reverse-cyclically connected to the shift signal line 72-q (q=0, 2, or 1). The anode A of the shift thyristor T(2, p) belonging to the block group @2 with a positive p (p=1, 2, or 3) is cyclically connected to the shift signal line 72-q (q=0, 1, or 2). Further in the block group @2, the anode A of the shift thyristor T(2, p) with a negative p (p=-1, -2, or -3) is reverse-cyclically connected to the shift signal line 72-q (q=1, 0, or 2). Specifically, the anode A of the shift thyristor T with the positive p=1, 2, 3 . . . is cyclically connected to the shift signal line 72 connected to the shift thyristor T(n, 0), with the connection starting with a shift signal line 72 having a number succeeding to q, and the anode A of the shift thyristor T with the negative p=-1, -2, -3 . . . is reverse-cyclically connected, with the connection starting with a shift signal line 72 having a number succeeding to q. The same connection configuration is applicable even when the number of shift thyristors T is different.

The connection configuration of the power source line 71, ground line 73, and light emission signal line 74 is identical the connection configuration in the light emitter 20.

Operation of Light Emitter 30

Figure 11:
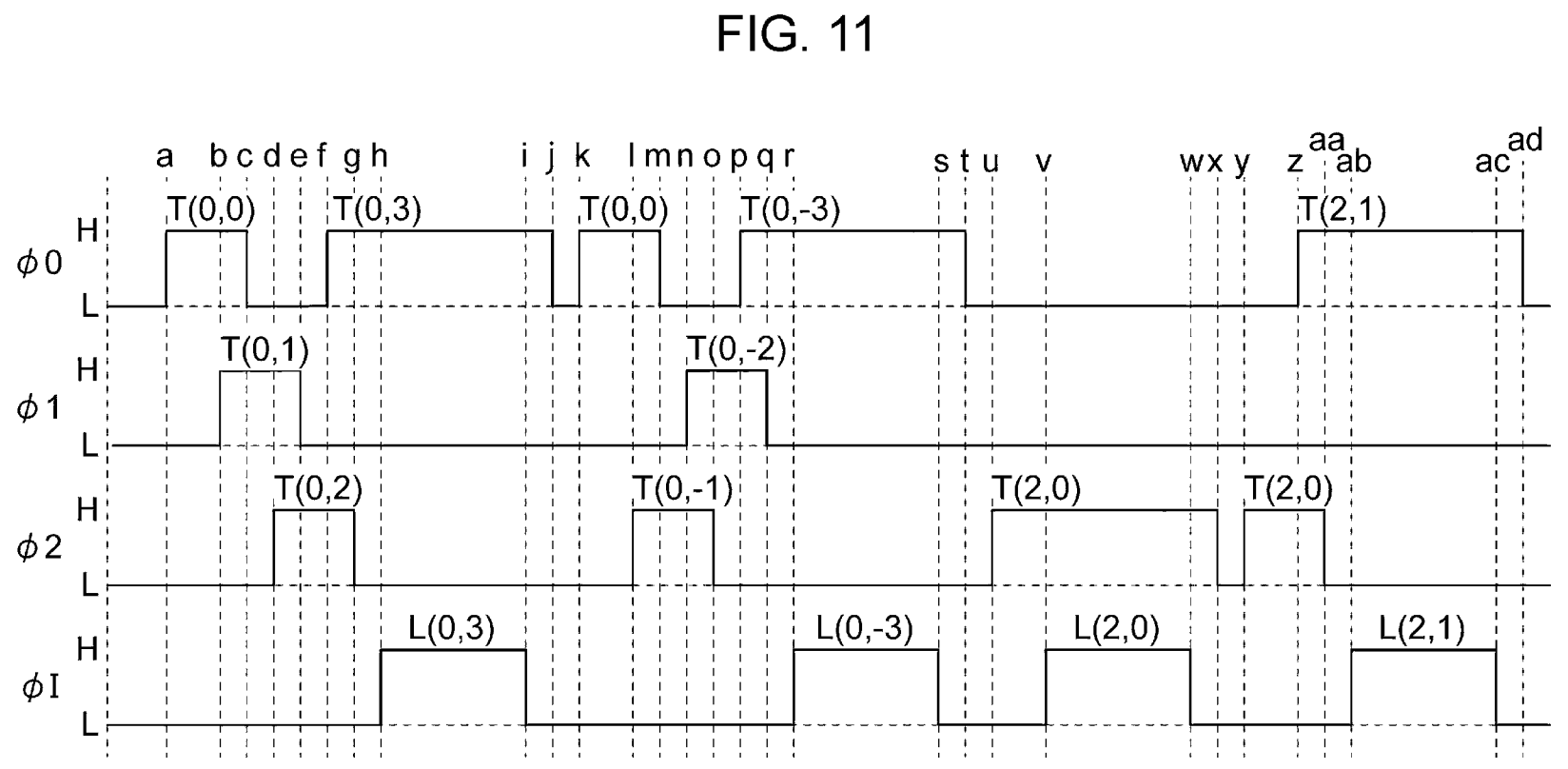

FIG. 11 is a timing diagram illustrating the operation of the light emitter 30. Horizontal axes represent time, and time a through time ad elapse in this order. FIG. 11 illustrates time changes in the shift signals φ0, #1, and φ2 and light emission signal φI. Referring to FIG. 11, the numbers attached to the shift thyristors T and light emitting thyristors L that are in the on state are illustrated.

The light emitting thyristors L(0, 3), L(0, -3), L(2, 0), and L(2, 1) in the light emitter 30 are lit. After the light emitting thyristor L(0, 3) is lit in the default state, the light emitter 30 reverts back to the default state and the light emitting thyristor L(0, -3) is lit. The other light emitting thyristors L operates in the same way. Any light emitting thyristors L is selected and lit. In other words, the light emitting thyristors L are randomly lit.

Referring to FIG. 10, the light emitting thyristor L(0, 3) may be lit by transitioning the shift thyristor T(0, 3) to the on state. The light emitting thyristor L(0, -3) may be lit by transitioning the shift thyristor T(0, -3) to the on state. The light emitting thyristor L(2, 0) may be lit by transitioning the shift thyristor T(2, 0) to the on state. The light emitting thyristor L(2, 1) may be lit by transitioning the shift thyristor T(2, 1) to the on state.

The timing diagram in FIG. 11 is described with reference to FIG. 10.

The light emitter 30 is in the default state prior to time a. The default state refers to the state in which the ground line 73 is set to the ground voltage GND (0 V), the power source line 71 is set to the power source voltage VGK, and the shift signals 40, φ1 and φ2 are set to L (0 V). The shift thyristors T(0, 0), (1, 0), and (2, 0) with the n-gates Gn thereof at 0.55 V are thus ready to transition to the on state.

When the shift signal φ0 changes from L (0 V) to H (3.3 V) at time a, the shift thyristor T(0, 0) is turned on, transitioning from the off state to the on state. The shift thyristor T(1) and shift thyristor T(−1) with the n-gates Gn at 0.8 V are ready to transition to the on state. This state is identical to the state of the light emitter 20 illustrated in FIG. 9. Since the shift signal φ1 and the shift signal φ2 remain at L (0 V), the shift thyristor T(1, 0) and shift thyristor T(2, 0) are not turned on.

From time b to time t, the light emitter 30 operates like the light emitter 20 illustrated in FIG. 9. Specifically, the light emitting thyristor L(0, 3) is lit at time h, and the light emitting thyristor L(0, −3) is lit at time r. Throughout this period, the shift operation proceeds in the block φ1 or the block φ2 in the block group @0. The shift thyristors T in the block groups @1 and @2 are inactive.

When the shift signal φ0 changes from H (3.3 V) to L (0 V) at time t, the shift thyristor T(0, −3) transitions from the on state to the off state, reverting back to the default state. Specifically, all the shift thyristors T are in the off state. The shift thyristors T(0, 0), T(1, 0), and T(2, 0) with the n-gates Gn at 0.55 V are thus ready to transition to the on state.

When the shift signal φ2 changes from L (0 V) to H (3.3 V) at time u, the shift thyristor T(2, 0) is turned on, transitioning from the off state to the on state. The coupling transistor Q (with no labeling) connected to the shift thyristor T(2, 0) is turned on and the n-gate Gn of the light emitting thyristor L(2, 0) connected to the collector Cs of the coupling transistor Q changes to 0.3 V.

When the light emission signal φI changes from L (0 V) to H (3.3 V) at time v, the anode of the light emitting thyristor L(2, 0) changes to H (3.3 V). Since the voltage difference (3.0 V) between the anode (H (3.3 V)) and the n-gate Gn (0.3 V) is equal to or higher than the forward voltage Vd (1.5 V), the light emitting thyristor L(2, 0) is forward-biased. The light emitting thyristor L(2, 0) is thus turned on and lit (transitioning from the off state to the on state).

When the light emission signal φI changes from H (3.3 V) to L (0 V) at time w, the anode and cathode of the light emitting thyristor L(2, 0) changes to 0 V. The light emitting thyristor L(2, 0) is turned off and unlit (transitioning from the on state to the off state).

When the shift signal φ2 changes from H (3.3 V) to L (0 V) at time x, the shift thyristor T(2, 0) is turned off, transitioning from the on state to the off state, and thus reverting back to the default state. Specifically, all the shift thyristors T are in the off state. The shift thyristors T(0, 0), T(1, 0), and T(2, 0) are ready to transition to the on state.

When the shift signal φ2 changes from L (0 V) to H (3.3 V) at time y, the shift thyristor T(2, 0) is turned on, transitioning from the off state to the on state. As previously described, both the shift thyristors T(2, 1) and T(2, −1) are ready to transition to the on state.

When the shift signal φ0 changes from L (0 V) to H (3.3 V) at time z, the shift thyristor T(2, 1) with the anode changed to H (3.3 V) is turned on. The coupling transistor Q (with no labeling) connected to the shift thyristor T(2, 1)

is turned on and the n-gate Gn of the light emitting thyristor L(2, 1) connected to the collector Cs of the coupling transistor Q changes to 0.3 V.

When the shift signal φ2 changes from H (3.3 V) to L (0 V) at time aa, the shift thyristor T(2, 0) is turned off.

When the light emission signal φI changes from L (0 V) to H (3.3 V) at time ab, the light emitting thyristor L(2, 1) is turned on and lit (transitioning from the off state to the on state).

When the light emission signal φI changes from H (3.3 V) to L (0 V) at time ac, the shift thyristor T(2, 1) is turned off and unlit (transitioning from the on state to the off state).

When the shift signal φ0 changes from H (3.3 V) to L (0 V) at time ad, the shift thyristor T(2, 1) is turned off, reverting back to the default state.

As described above, even with the block groups @0, @1, and @2, each identical the block in the light emitter 20, a block group and a block included in the block group may be selected and shifted in accordance with the three the shift signal lines 72-0, 72-1, and 72-2 respectively supplying the shift signals φ0, #1, and φ2. Specifically, the phases of three-phase shift signals φ0, #1, and φ2 select the block group and the block included in the block group that operate in the shift operation.

In order to control the lighting of 21 light emitting thyristors L included in the light emitter 30, the light emitter 10' of the related art illustrated in FIG. 6 has 21 as the maximum number of steps while the light emitter 30 reduces the maximum number of steps to less than one-fifth, namely, has a maximum number of steps of four. In other words, the time to perform the shift operation to set the light emitting thyristors L to be lit may be reduced to about one-fifth.

The number of light emitting thyristors L serving as the light emitting points is not limited to 21. The number of block groups is not limited to three (the block groups @0, @1, and @2). If n shift lines are arranged for n block groups (n is an integer of 3 or higher), each block group may be individually selected. Specifically, the use of three-phase or more-phase shift lines is sufficient. The number of light emitting thyristors L in each block in each block group may be equal from block to block or different from block to block.

The light emitters 10, 20, and 30 of the first exemplary embodiment through the third exemplary embodiment employ the light emitting thyristor L as an example of the light emitting point. A light emitting diode (LED) or a laser diode (LD) may be arranged on the side of the anode or the cathode of the light emitting thyristor L. The use of the LED or the LD may provide a configuration appropriate for light emission and an improvement in light emission characteristics. The LD may be a surface emitting element. The surface emitting element may be a vertical cavity surface emitting laser. The vertical cavity surface emitting laser may provide a higher emission intensity.

Figures 12A, 12B:
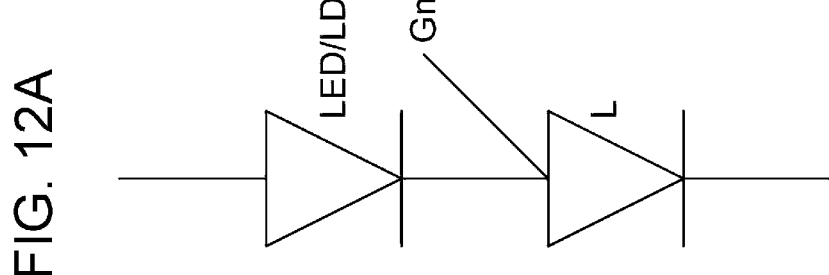

FIGS. 12A and 12B illustrate modifications of the light emitting points. FIG. 12A illustrates the LED or LD arranged on the anode side of the light emitting thyristor L and FIG. 12B illustrates the LED or LD arranged on the cathode side of the light emitting thyristor L. Referring to FIGS. 12A and 12B, the light emitting diode or the laser diode is denoted by LED/LD. In such a case, the light emitting thyristor L is used as a light emission control thyristor.

According to the first and second exemplary embodiments, the two-phase shift signal lines and two blocks are used and the three-phase shift signal lines and two blocks are used. Any configuration may be acceptable as long as the two-phase or more-phase shift signal lines and two or more blocks are used.

According to the first through third exemplary embodiments, the light emitters 10, 20, and 30 are based on a cathode-common connection. Alternatively, the light emitters 10, 20, and 30 may be based on a anode-common connection. The n-ohmic electrode is arranged in the n-gate layer (the n-type semiconductor layer 83). Alternatively, a p-ohmic electrode may be arranged on the p-gate layer (the p-type semiconductor layer 82).

In the shifting unit 12 in the light emitter 10, the coupling transistor is connected between the light emitting thyristors. Alternatively, a diode or a resistor may be employed in place of the coupling transistor.

Measurement Apparatus 100

The light source devices 1, 2, and 3 of the first through third exemplary embodiments are applicable to a measurement apparatus that measures a three-dimensional (3D) shape serving as a measurement target. The measurement apparatus measures the 3D shape in accordance with a time-of-flight (ToF) method. The measurement apparatus includes a light source device and a 3D sensor. The ToF method measures time from the timing when light is emitted from the light source device to the timing when the 3D sensor receives light that is reflected from the measurement target. The distance to the measurement target is calculated from the time acquired by the 3D sensor and the 3D shape of the measurement target is thus identified. The measurement of the 3D shape may also referred to as 3D measurement or 3D sensing. The 3D sensor is an example of a light receiver.

The measurement apparatus may be used to recognize a measurement target in accordance with the identified 3D shape. For example, the measurement apparatus may be mounted on a portable information processing device and used to recognize a face of a user that is accessing the portable information processing device. Specifically, the measurement apparatus acquires a 3D shape of the accessing user and determines whether the user is granted to access. Only when the user granted to access is recognized, the user is permitted to use the portable information processing apparatus.

The measurement apparatus is also applicable to augmented reality (AR) to continuously measure the 3D shape of a measurement target.

The measurement apparatus is also applicable to an information processing apparatus, such as a personal computer, other than the portable information processing apparatus.

Figure 13:
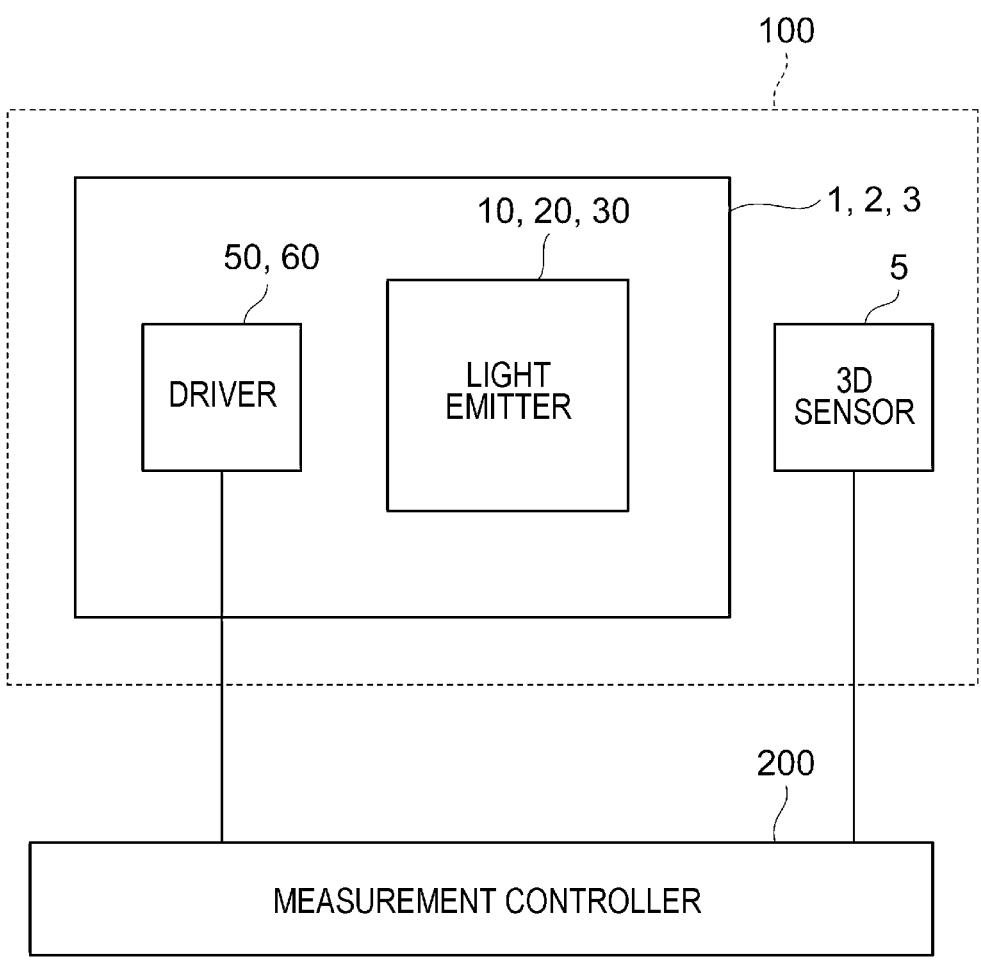
FIG. 13 is a block diagram illustrating a configuration of a measurement apparatus.

FIG. 13 is a block diagram illustrating a configuration of a measurement apparatus 100. The measurement apparatus 100 includes the light emitter 10, 20, or 30, the driver 50 or 60, the light source device 1, 2, or 3, and a 3D sensor 5. The light source device 1, 2, or 3 emits light toward a measurement target. The 3D sensor 5 acquires light reflected from the measurement target. The 3D sensor 5 outputs information on a distance to the measurement target based on time from the emission of light to the reception of the reflected light. The time from the emission of the light to the reception of the reflected light is measured in accordance with the ToF method. The measurement apparatus 100 may include a measurement controller 200. The measurement controller 200 is a computer including a central processing unit (CPU), read-only memory (ROM), random-access memory (RAM), and the like. The measurement controller 200 identifies the 3D shape of a measurement target in accordance with distance information acquired by the 3D sensor 5.

The foregoing description of the exemplary embodiments of the present disclosure has been provided for the purposes of illustration and description. It is not intended to be exhaustive or to limit the disclosure to the precise forms disclosed. Obviously, many modifications and variations will be apparent to practitioners skilled in the art. The embodiments were chosen and described in order to best explain the principles of the disclosure and its practical applications, thereby enabling others skilled in the art to understand the disclosure for various embodiments and with the various modifications as are suited to the particular use contemplated. It is intended that the scope of the disclosure be defined by the following claims and their equivalents.

What is claimed is:

1. A light emitter comprising:
   a light emitting unit that has a plurality of light emitting points; and
   a shifting unit that sets in a shift operation the light emitting points that are to be lit by the light emitting unit,
   wherein the shifting unit includes a plurality of starting points where the shift operation starts, a plurality of blocks that undergo the shift operation from the starting points, and a shift signal line that is commonly arranged for the blocks and selects a block that is to undergo the shift operation in response to a shift signal, and
   the shifting unit comprises three-phase shift signal lines and two blocks that share the starting point.

2. The light emitter according to claim 1, wherein the blocks are arranged on a semiconductor substrate.

3. The light emitter according to claim 2, wherein the shift signal line is connected to a common connection terminal arranged on the semiconductor substrate.

4. The light emitter according to claim 3, wherein the block that is to undergo the shift operation is selected in accordance with a phase of the shift signal supplied to the two-phase shift signal line.

5. A light source device comprising:
   the light emitter according to claim 4; and
   a driver that supplies a shift signal to the shifting unit and supplies a current to the light emitting unit in the light emitter to cause the light emitting unit to emit light.

6. A light source device comprising:
   the light emitter according to claim 2; and
   a driver that supplies a shift signal to the shifting unit and supplies a current to the light emitting unit in the light emitter to cause the light emitting unit to emit light.

7. A light source device comprising:
   the light emitter according to claim 3; and
   a driver that supplies a shift signal to the shifting unit and supplies a current to the light emitting unit in the light emitter to cause the light emitting unit to emit light.

8. The light emitter according to claim 1, wherein the shifting unit comprises two-phase or more-phase shift signal lines and two or more blocks that have respectively different starting points.

9. The light emitter according to claim 8, wherein the shifting unit comprises two-phase shift signal lines and two blocks that have respectively different starting points, and
   wherein the starting point of one of the two blocks is connected to one of the two-phase shift signal lines, and the starting point of the other of the two blocks is connected to the other of the two-phase shift signal lines.

10. A light source device comprising:

the light emitter according to claim 9; and a driver that supplies a shift signal to the shifting unit and supplies a current to the light emitting unit in the light emitter to cause the light emitting unit to emit light.

11. A light source device comprising:

the light emitter according to claim 8; and a driver that supplies a shift signal to the shifting unit and supplies a current to the light emitting unit in the light emitter to cause the light emitting unit to emit light.

12. The light emitter according to claim 1, wherein the starting point is connected to one of the three-phase shift signal lines, one of the two blocks is cyclically connected to the three-phase shift signal lines, with connection starting with the starting point and the other of the two blocks is reverse-cyclically connected to the three-phase shift signal lines, with connection starting with the starting point.

13. The light emitter according to claim 12, wherein a phase of the shift signal supplied to the three-phase shift signal line specifies a shift direction and selects a block that is to undergo the shift operation.

14. The light emitter according to claim 12, wherein a phase of a first shift signal supplied to a first shift signal line connected to the starting point selects, from among the block groups included in the shifting unit, a block group that is to undergo the shift operation, and a second shift signal supplied to a second shift signal line specifies a shift direction, and selects a block that is to undergo the shift operation.

15. The light emitter according to claim 1, wherein the shifting unit comprises the three-phase signal or more-phase signal lines and a plurality of block groups, each block group including two blocks sharing the starting point, and wherein the starting points of the block groups are respectively connected to different shift signal lines, one of the two blocks included in each of the block groups is cyclically connected to the shift signal line to which the block group is connected, with connection starting with the starting point, and the other of the two blocks is reverse-cyclically connected to the shift signal line to which the block group is connected, with connection starting with the starting point.

16. The light emitter according to claim 1, wherein the shifting unit comprises shift elements that are successively turned on in an order of arrangement.

17. A light source device comprising:

the light emitter according to claim 1; and a driver that supplies a shift signal to the shifting unit and supplies a current to the light emitting unit in the light emitter to cause the light emitting unit to emit light.

18. A measurement apparatus comprising:

the light source device according to claim 17; and a light receiver that receives light reflected from a measurement target in response to light emitted from the light emitting unit in the light source device.

* * * * *